(12) United States Patent
Chang et al.

(10) Patent No.: US 11,699,589 B2
(45) Date of Patent: Jul. 11, 2023

(54) METHOD FOR FORMING PATTERNED MASK LAYER

(71) Applicant: Taiwan Semiconductor Manufacturing Company, Ltd., Hsinchu (TW)

(72) Inventors: Yu-Chen Chang, Hsinchu (TW); Chien-Wen Lai, Hsinchu (TW); Chih-Min Hsiao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 33 days.

(21) Appl. No.: 17/389,602

(22) Filed: Jul. 30, 2021

(65) Prior Publication Data

US 2023/0030767 A1    Feb. 2, 2023

(51) Int. Cl.
  *H01L 21/033*     (2006.01)
  *H01L 21/308*     (2006.01)
  *H01L 21/3213*    (2006.01)

(52) U.S. Cl.
  CPC ...... *H01L 21/0337* (2013.01); *H01L 21/0332* (2013.01); *H01L 21/0338* (2013.01); *H01L 21/308* (2013.01); *H01L 21/3086* (2013.01); *H01L 21/3088* (2013.01); *H01L 21/32139* (2013.01); *Y10S 438/947* (2013.01); *Y10S 438/95* (2013.01)

(58) Field of Classification Search
  None
  See application file for complete search history.

(56) References Cited

U.S. PATENT DOCUMENTS

2007/0059914 A1*  3/2007  Jung ............... H01L 21/0337
                                                      438/597
2019/0057871 A1*  2/2019  Shih ............... H01L 21/0335

\* cited by examiner

*Primary Examiner* — Jiong-Ping Lu
(74) *Attorney, Agent, or Firm* — Birch, Stewart, Kolasch & Birch, LLP

(57) ABSTRACT

A method for forming a patterned mask layer is provided. The method includes forming a first layer over a substrate. The method includes forming a first strip structure and a second strip structure over the first layer. The method includes forming a spacer layer conformally covering the first strip structure, the second strip structure, and the first layer. The method includes forming a block structure in the first trench. The method includes removing a first portion of the spacer layer, which is under the first trench and not covered by the block structure, and a second portion of the spacer layer, which is over the first strip structure and the second strip structure. The method includes forming a third strip structure in the second trench and the third trench. The method includes removing the block structure. The method includes removing the spacer layer.

20 Claims, 47 Drawing Sheets

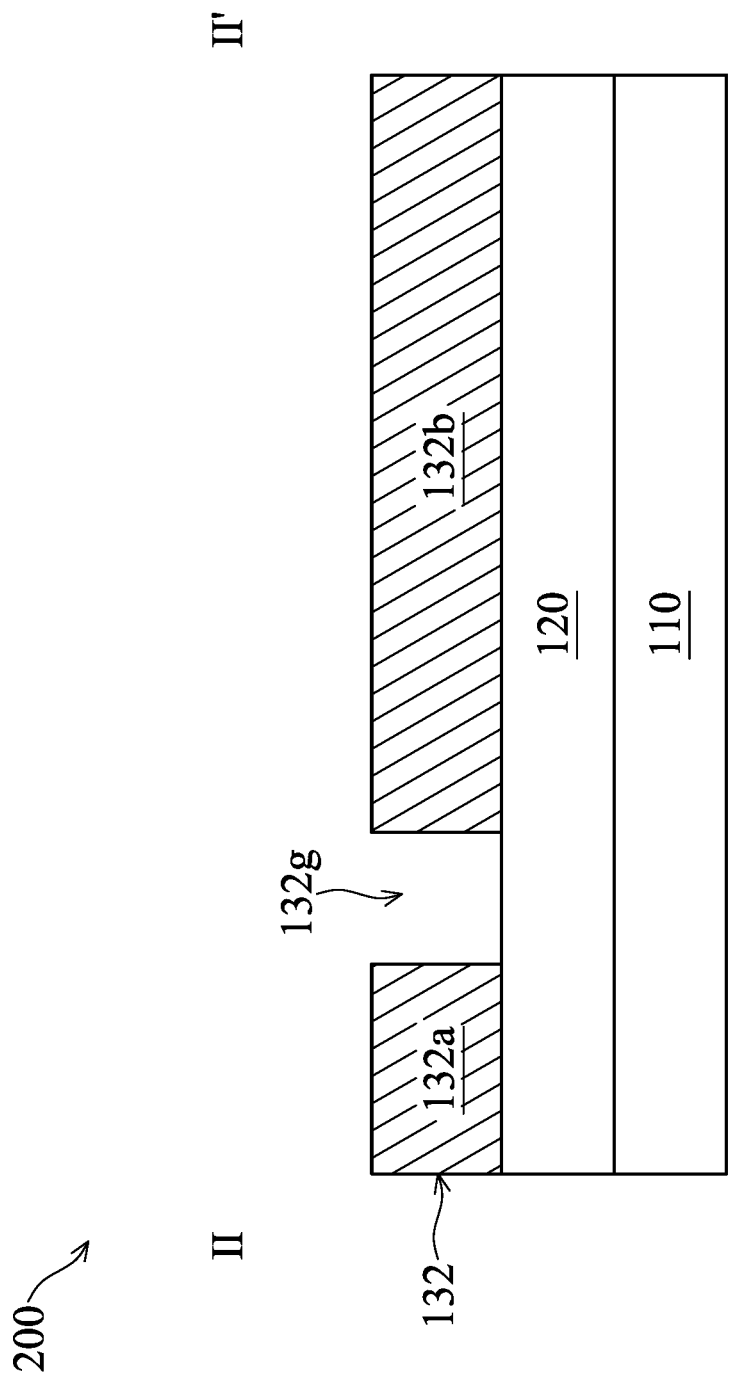

METHOD FOR FORMING PATTERNED MASK LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes (e.g., patterning processes) continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1C-1 are cross-sectional views illustrating the semiconductor device structure along sectional lines I-I' in FIGS. 1A-1C, in accordance with some embodiments.

FIGS. 1A-2 to 1C-2 are cross-sectional views illustrating the semiconductor device structure along sectional lines II-II' in FIGS. 1A-1C, in accordance with some embodiments.

FIGS. 1A-3 to 1B-3 are cross-sectional views illustrating the semiconductor device structure along sectional lines in FIGS. 1A-1B, in accordance with some embodiments.

FIG. 1C-3 is a cross-sectional view illustrating the semiconductor device structure along a sectional line in FIG. 1C, in accordance with some embodiments.

FIGS. 2A-1 to 2H-1 are cross-sectional views illustrating the semiconductor device structure along sectional lines I-I' in FIGS. 2A-2H, in accordance with some embodiments.

FIGS. 2A-2 to 2H-2 are cross-sectional views illustrating the semiconductor device structure along sectional lines II-II' in FIGS. 2A-2H, in accordance with some embodiments.

FIG. 2E-3 is a cross-sectional view illustrating the semiconductor device structure along a sectional line in FIG. 2E, in accordance with some embodiments.

FIGS. 2G-3 to 2H-3 are cross-sectional views illustrating the semiconductor device structure along sectional lines in FIGS. 2G-2H, in accordance with some embodiments.

DETAILED DESCRIPTION

Figure 1A:
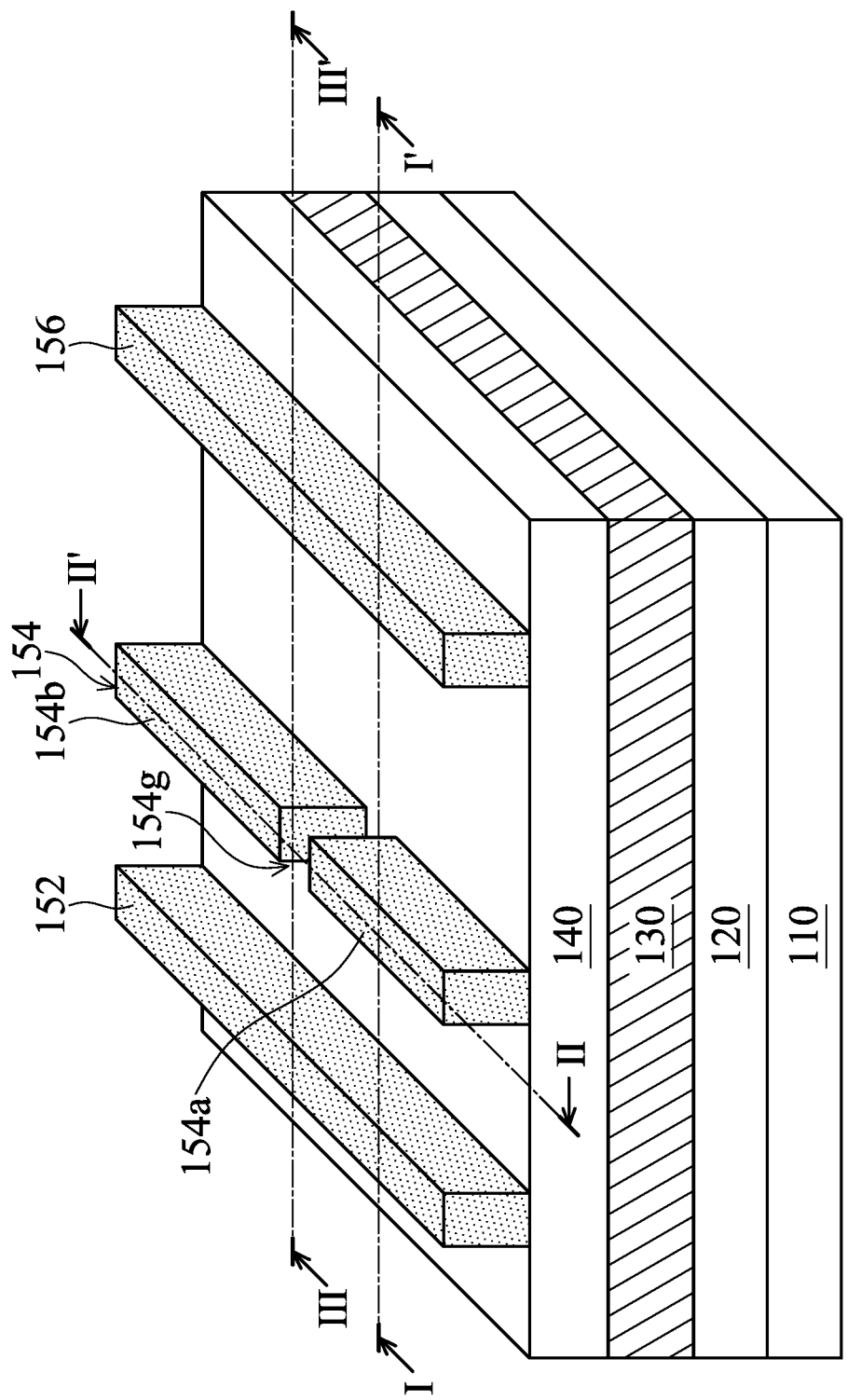
FIGS. 1A-1C are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1A:
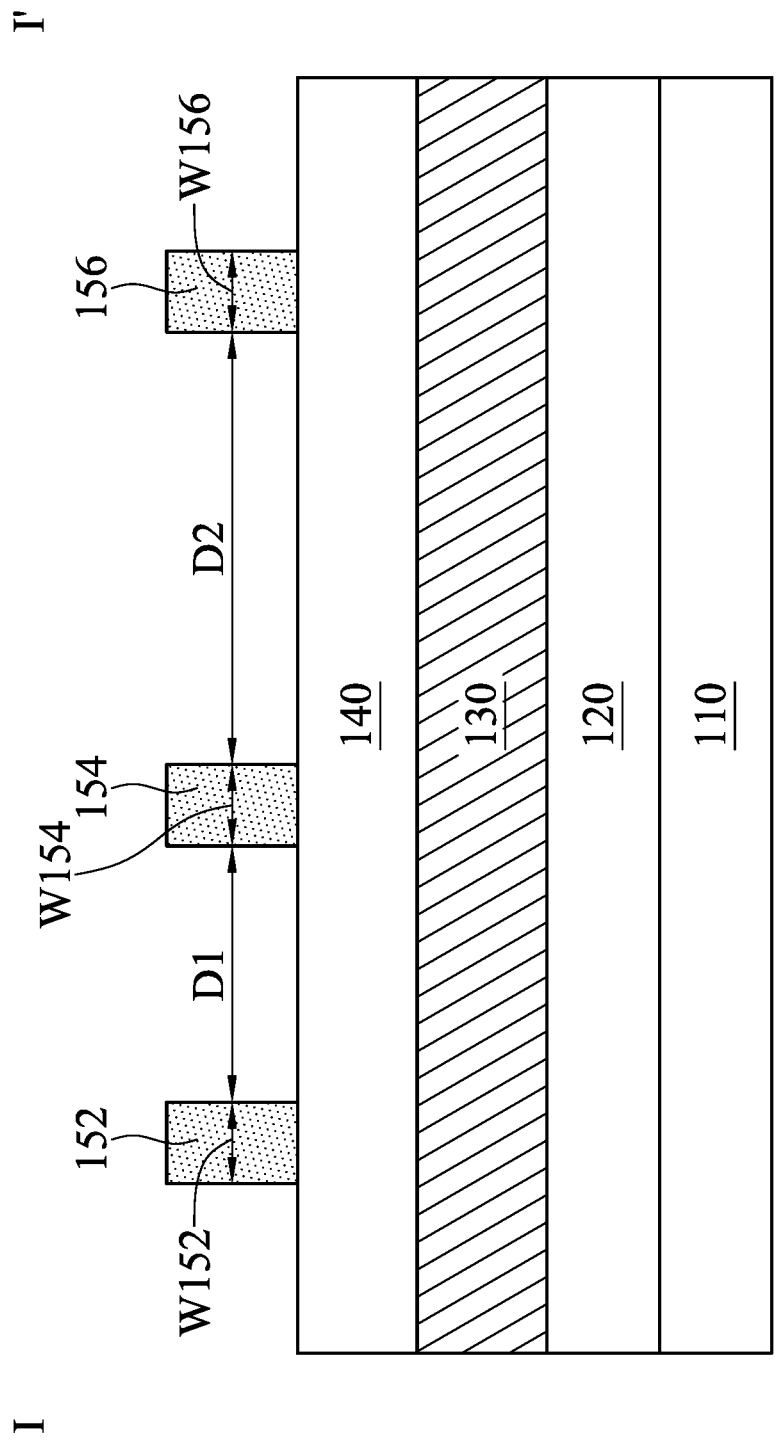
Figures 1, 1A, 2:
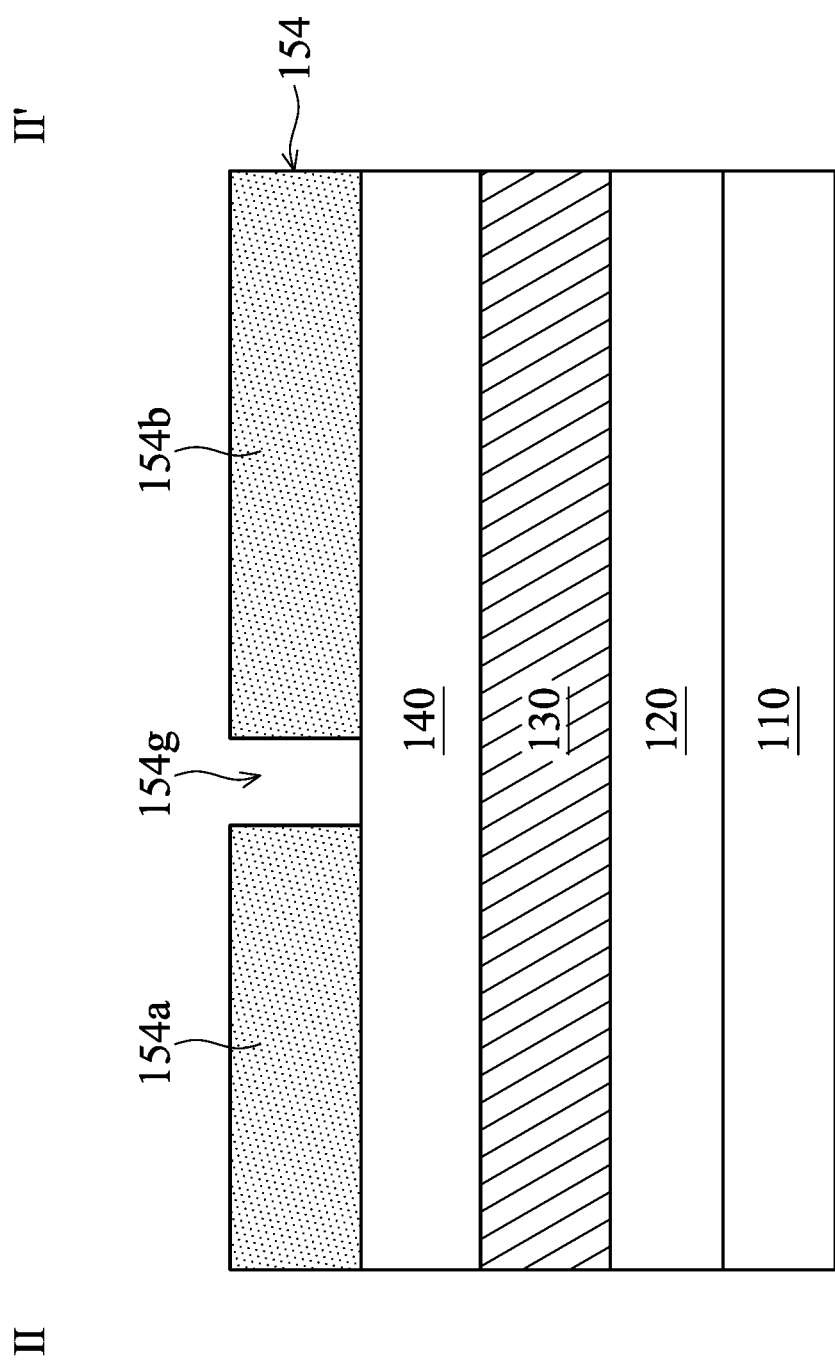
Figures 1, 1A, 2, 3:
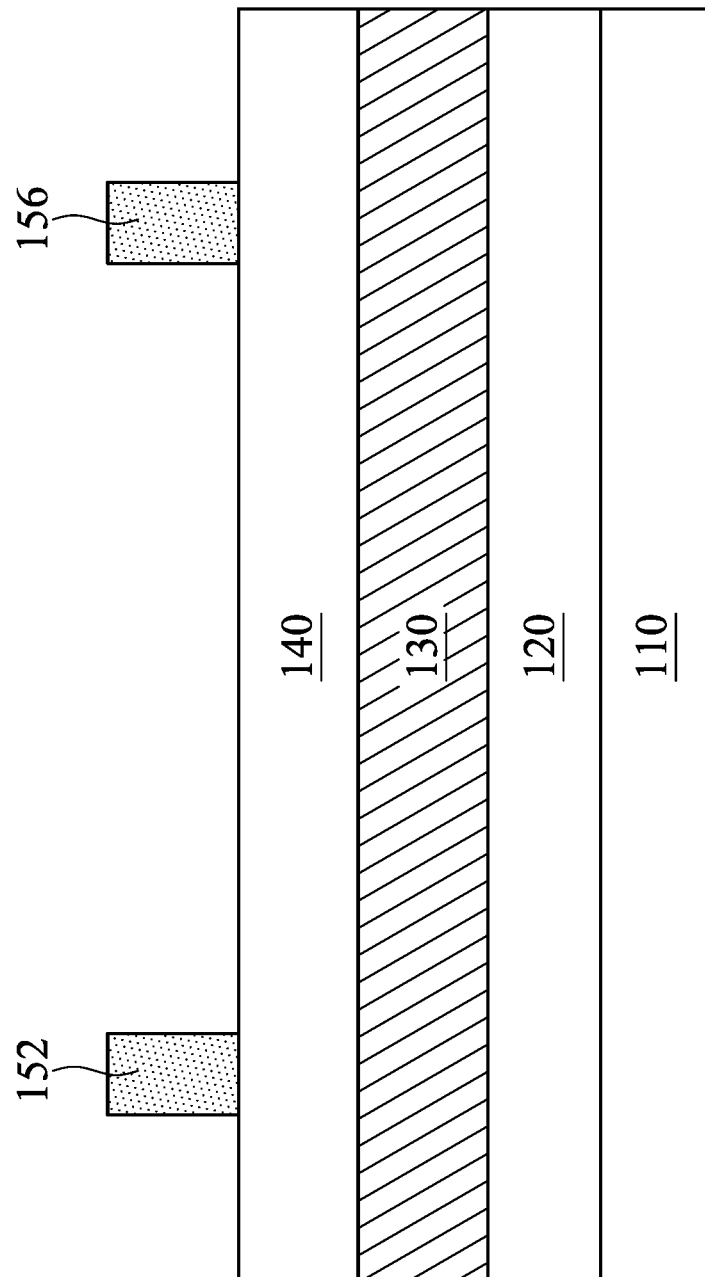
Figure 1B:
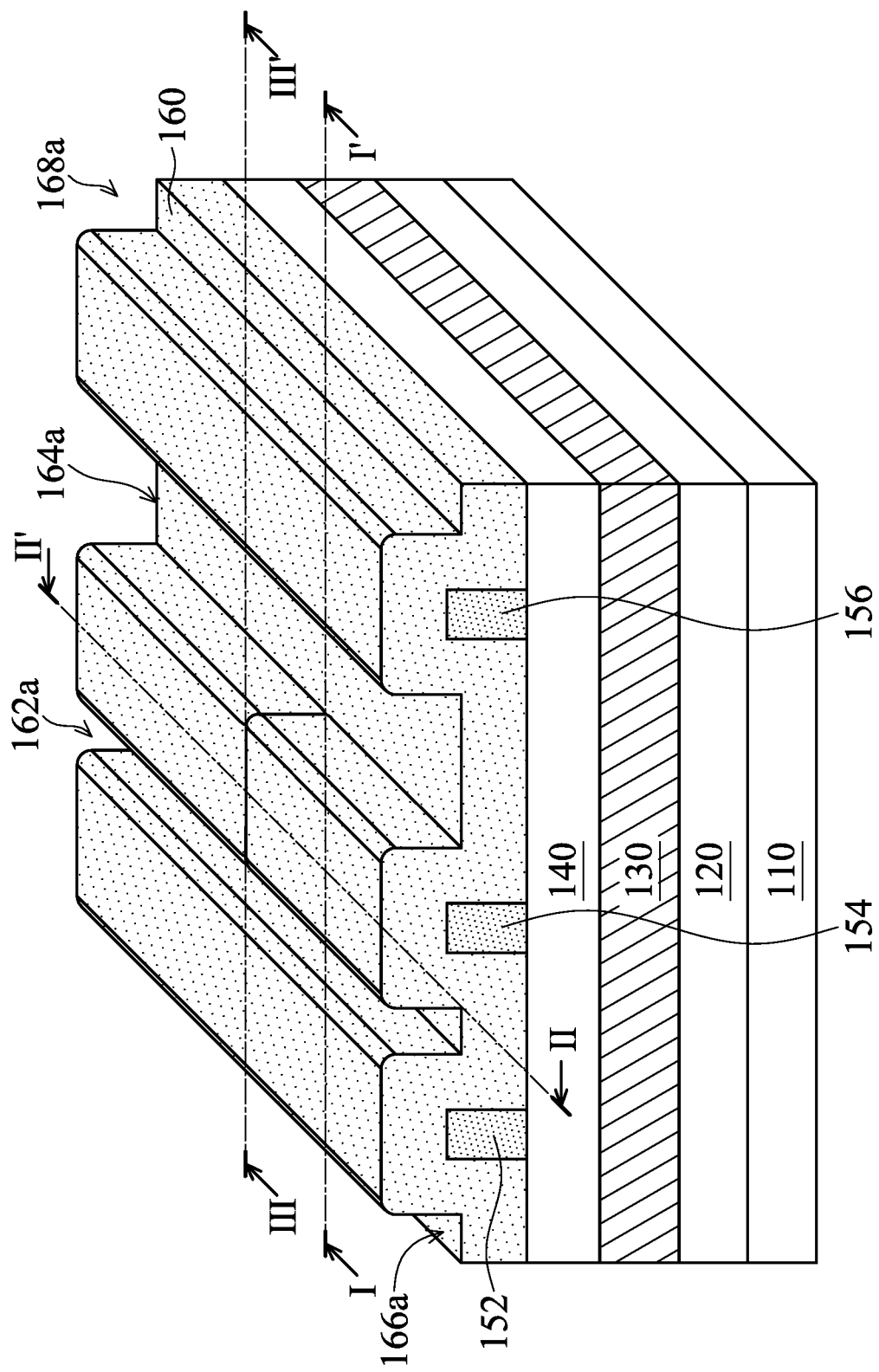
Figures 1, 1B:
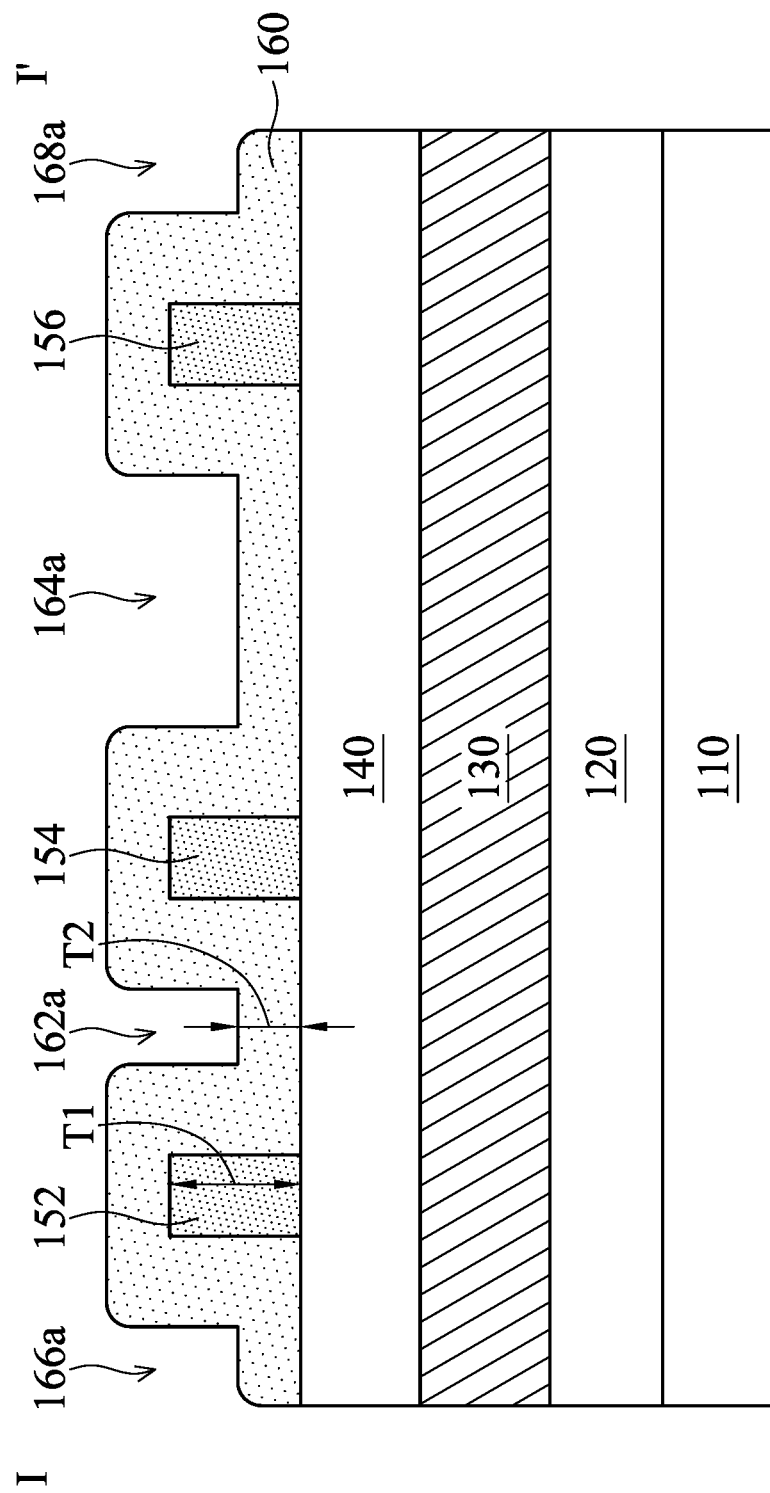
Figures 1, 1B, 2:
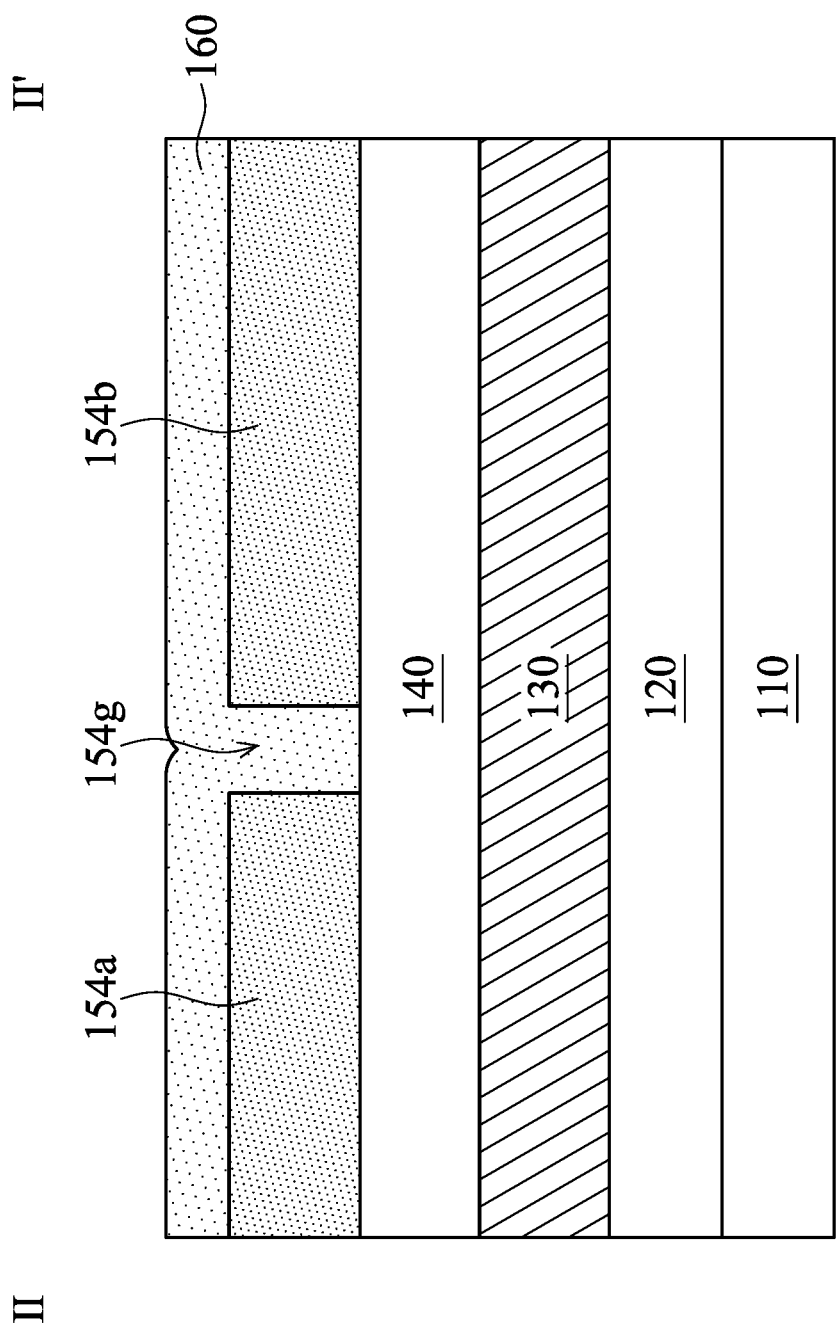
Figures 1, 1B, 2, 3:
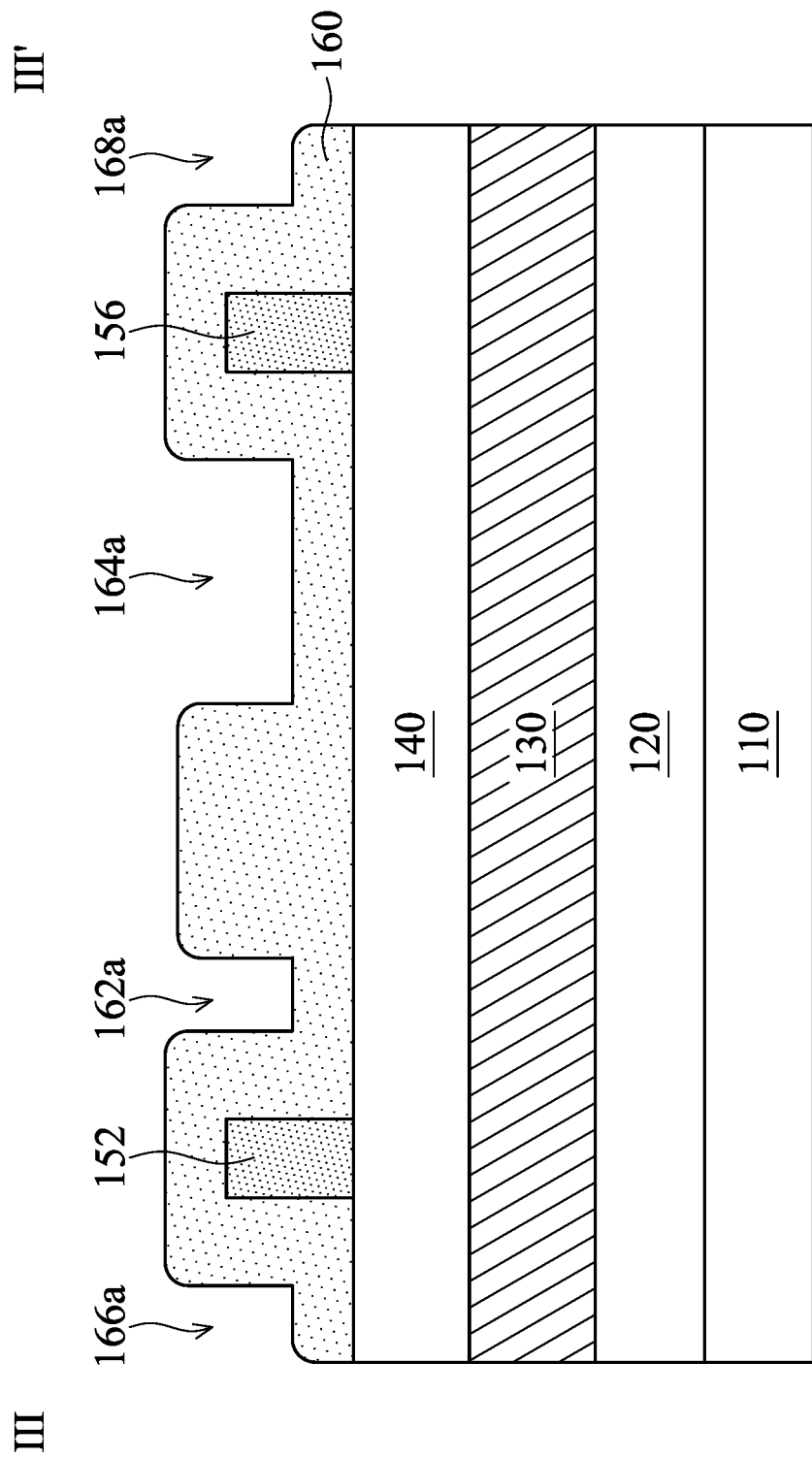
Figure 1C:
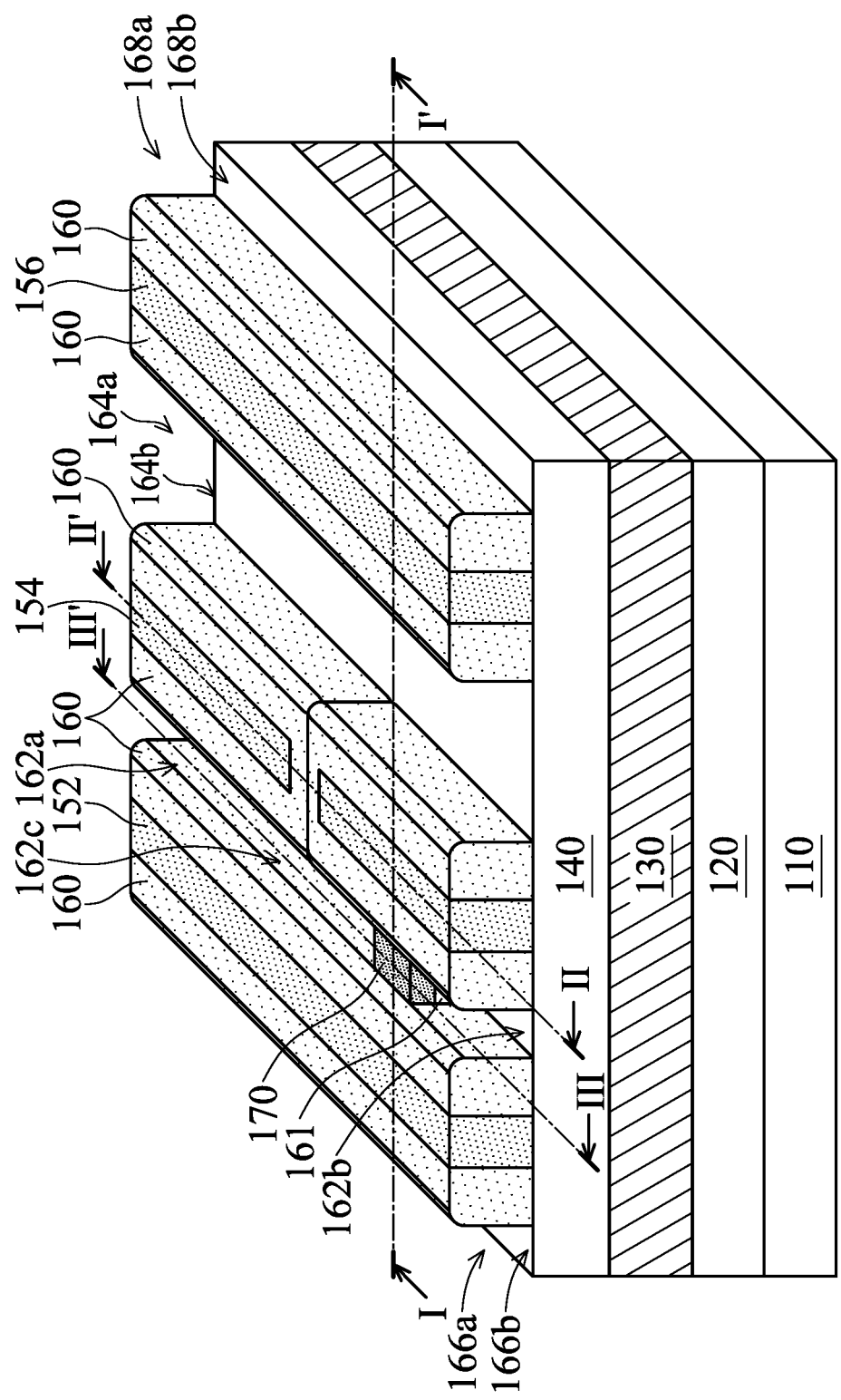
Figures 1, 1C:
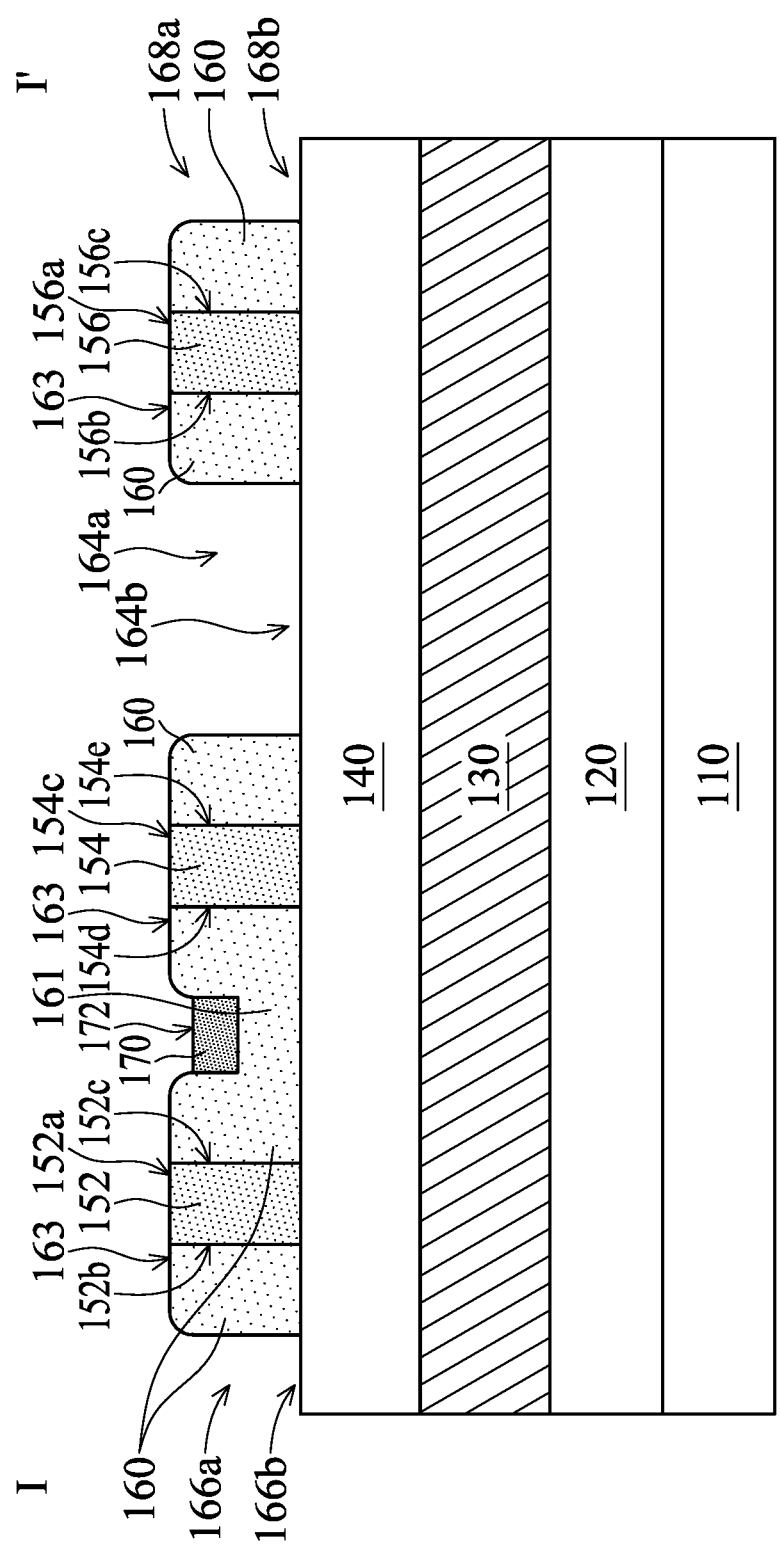
Figures 1, 1C, 2:
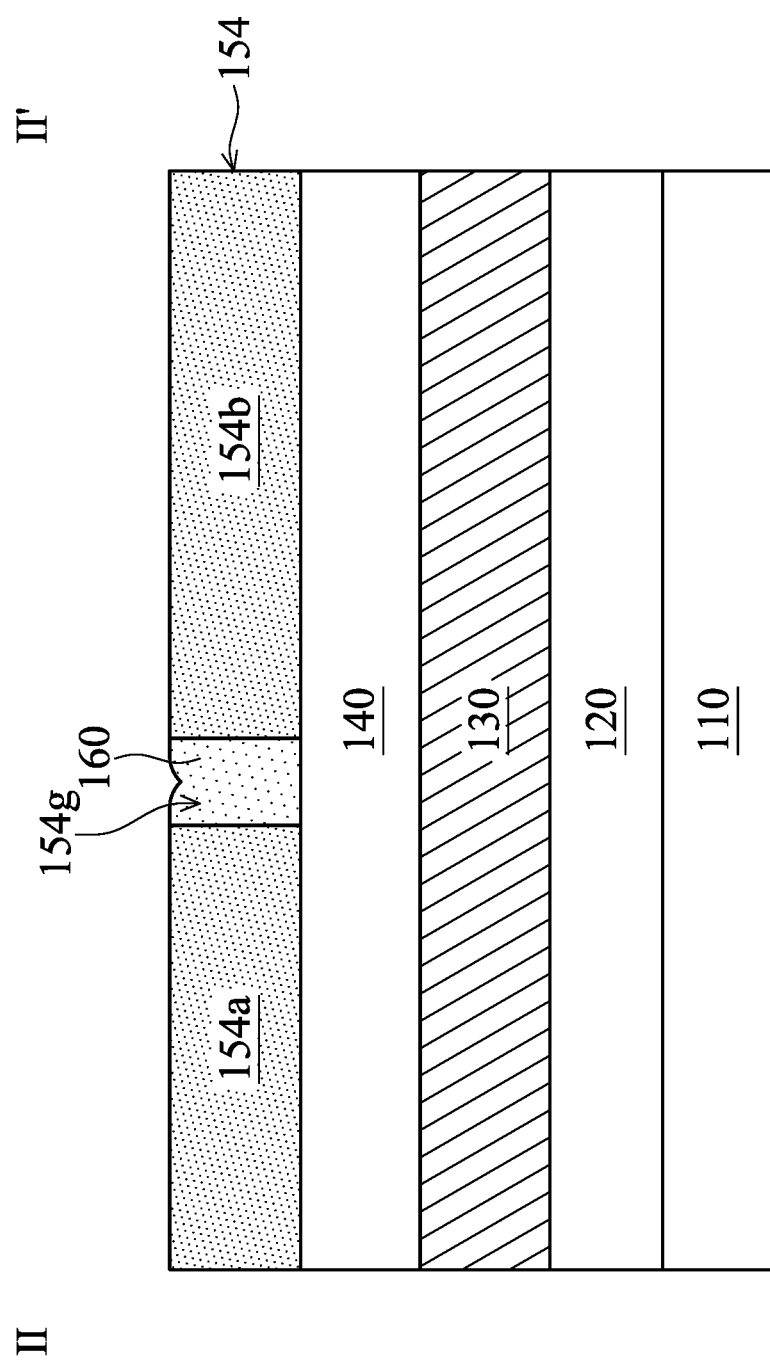
Figures 1, 1C, 2, 3:
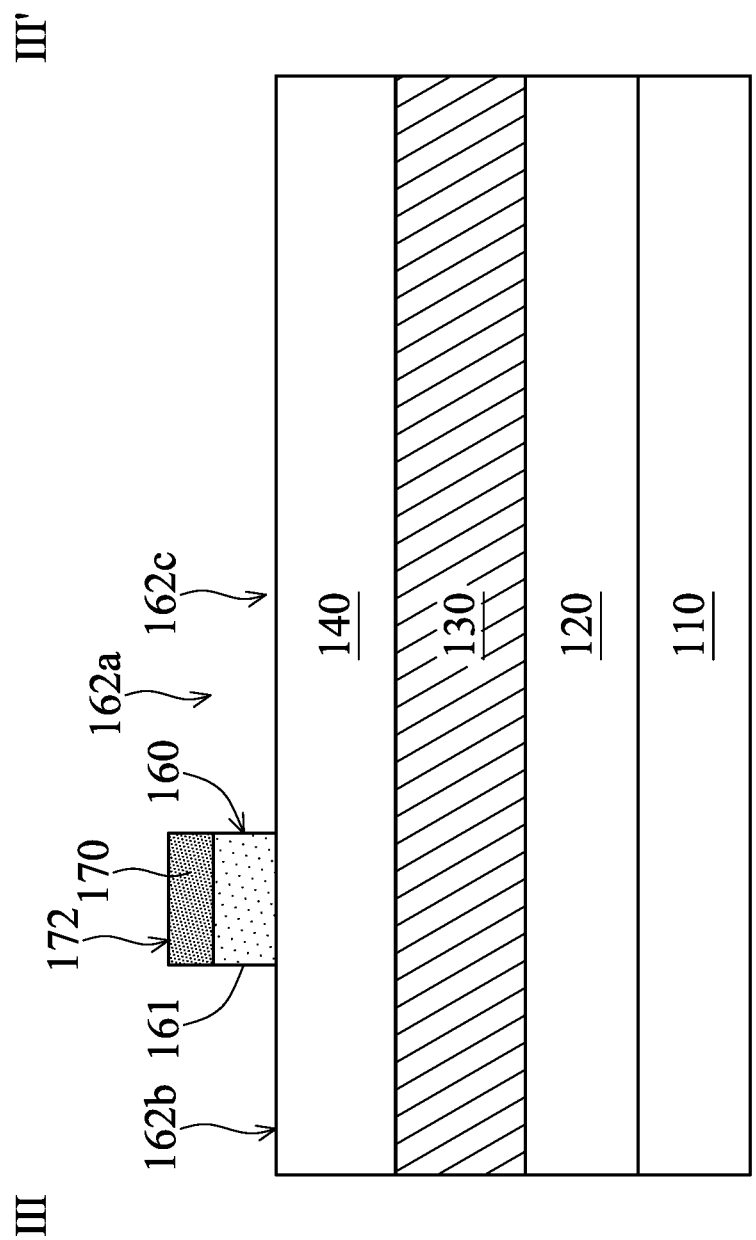

FIGS. 1A-1C are perspective views of various stages of a process for forming a semiconductor device structure, in accordance with some embodiments. FIGS. 1A-1 to 1C-1 are cross-sectional views illustrating the semiconductor device structure along sectional lines I-I' in FIGS. 1A-1C, in accordance with some embodiments.

FIGS. 1A-2 to 1C-2 are cross-sectional views illustrating the semiconductor device structure along sectional lines II-II' in FIGS. 1A-1C, in accordance with some embodiments. FIGS. 1A-3 to 1B-3 are cross-sectional views illustrating the semiconductor device structure along sectional lines in FIGS. 1A-1B, in accordance with some embodiments.

As shown in FIGS. 1A and 1A-1, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a dielectric layer 120 is deposited over the substrate 110, in accordance with some embodiments. The dielectric layer 120 may serve as an interlayer dielectric (ILD) layer or an inter-metal dielectric (IMD) layer of an interconnection structure, in accordance with some embodiments.

The dielectric layer 120 covers device elements formed in and/or over the substrate 110, in accordance with some embodiments. Although FIG. 1A shows that the dielectric layer 120 is a single layer, embodiments of the disclosure are not limited thereto. In some other embodiments, the dielectric layer 120 is a multi-layer structure including dielectric sub-layers (not shown).

Multiple conductive features (not shown) are formed in the dielectric layer 120, in accordance with some embodiments. The conductive features may be electrically connected to gate structures or power devices formed on the substrate 110 or doped regions formed in the substrate 110. The conductive features may include conductive lines, conductive vias, conductive contacts, or a combination thereof.

In some embodiments, the conductive features are made of or include a conductive material, such as a metal material (e.g., copper, aluminum, tungsten, titanium, cobalt, nickel, gold, platinum, or a combination thereof). Various processes, including deposition, etching, planarization, or the like, may be used to form the conductive features in the dielectric layer 120.

In some embodiments, the dielectric layer 120 is made of or includes an insulating material, such as silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), one or more other suitable materials, or a combination thereof.

The low-k or ELK material may have a smaller dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. As the density of semiconductor devices increases and the size of circuit elements becomes smaller, the resistance capacitance (RC) delay time increasingly dominates circuit performance. Therefore, using a low-k or ELK material as the dielectric layer 120 is helpful in reducing the RC delay.

In some embodiments, the dielectric layer 120 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric material, one or more other suitable materials, or a combination thereof.

In some embodiments, the dielectric layer 120 is deposited using a chemical vapor deposition (CVD) process, an atomic layer deposition (ALD) process, a physical vapor deposition (PVD) process, a spin-on process, a spray coating process, one or more other applicable processes, or a combination thereof.

As shown in FIGS. 1A and 1A-1, a layer 130 is formed over the dielectric layer 120, in accordance with some embodiments. The dielectric layer 120 and the layer 130 are made of different materials, in accordance with some embodiments. The layer 130 is made of a conductive material, a dielectric material, or a semiconductor material, in accordance with some embodiments.

The conductive material includes a metal material or an alloy thereof, in accordance with some embodiments. The metal material includes copper, aluminum, tungsten, titanium, nickel, gold, platinum, silver, one or more other suitable materials, or a combination thereof, in accordance with some embodiments. The layer 130 is formed using a physical vapor deposition (PVD) process, a chemical vapor deposition (CVD) process, an atomic layer deposition (ALD) process, or another suitable process, in accordance with some embodiments.

The dielectric material includes an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric material includes a low-k material or a porous dielectric material having a k-value which is lower than that of silicon oxide, or lower than about 3.0 or about 2.5, in accordance with some embodiments. The layer 130 is formed using a CVD process, such as a low-pressure CVD process, a plasma-enhanced CVD process, or a high-density plasma CVD process, an atomic layer deposition process, a spin-on process, a physical vapor deposition process, or another suitable process.

The semiconductor material includes an elementary semiconductor material including silicon or germanium in a single crystal structure, a polycrystal structure, or an amorphous structure, in accordance with some embodiments. In some other embodiments, the semiconductor material includes a compound semiconductor, such as silicon carbide, gallium arsenide, gallium phosphide, indium phosphide, indium arsenide, an alloy semiconductor, such as SiGe or GaAsP, or a combination thereof.

As shown in FIGS. 1A and 1A-1, a mask layer 140 is formed over the layer 130, in accordance with some embodiments. The mask layer 140 and the layer 130 are made of different materials, in accordance with some embodiments. The mask layer 140 is made of or includes a dielectric material, such as a nitride-containing material or an oxide-containing material, in accordance with some embodiments.

The nitride-containing material includes SiON, SiCN, SiN, TiN, or a combination thereof, in accordance with some embodiments. The oxide-containing material includes HfO, $Al_2O_3$, $Ta_2O_5$, ZrO, $SiO_2$, SiON, or a combination thereof, in accordance with some embodiments.

The mask layer 140 is formed using a chemical vapor deposition (CVD) process, an atomic layer deposition (ALD) process, a physical vapor deposition (PVD) process, or a combination thereof, in accordance with some embodiments.

As shown in FIGS. 1A, 1A-1, 1A-2, and 1A-3, strip structures 152, 154, and 156 are formed over the mask layer 140, in accordance with some embodiments. The strip structures 152, 154, and 156 are also referred to as mandrel structures, in accordance with some embodiments. The strip structures 152, 154, and 156 are parallel to each other, in accordance with some embodiments.

As shown in FIG. 1A-1, a distance D1 between the strip structures 152 and 154 is less than a distance D2 between the strip structures 154 and 156, in accordance with some embodiments. In some other embodiments, the distance D1 is substantially equal to the distance D2. In still other embodiments, the distance D1 is greater than the distance D2. The distance D1 ranges from about 10 nm to about 150 nm, in accordance with some embodiments. The distance D2 ranges from about 10 nm to about 150 nm, in accordance with some embodiments.

As shown in FIG. 1A-1, the strip structures 152, 154, and 156 have widths W152, W154, and W156, in accordance with some embodiments. The widths W152, W154, and W156 are substantially equal to each other, in accordance with some embodiments. In some other embodiments, the widths W152, W154, and W156 are different from each other. The width W152, W154, or W156 ranges from about 10 nm to about 150 nm, in accordance with some embodiments.

As shown in FIGS. 1A and 1A-2, the strip structure 154 has a gap 154g, in accordance with some embodiments. The strip structure 154 has parts 154a and 154b, in accordance with some embodiments. The parts 154a and 154b are spaced apart from each other by the gap 154g, in accordance with some embodiments. The gap 154g exposes the mask layer 140, in accordance with some embodiments.

The mask layer 140 and the strip structures 152, 154, and 156 are made of different materials, in accordance with some embodiments. The strip structures 152, 154, and 156 are made of or include a dielectric material, such as a nitride-containing material or an oxide-containing material, in accordance with some embodiments. The nitride-containing material includes SiON, SiCN, SiN, TiN, or a combination thereof, in accordance with some embodiments. The oxide-containing material includes HfO, $Al_2O_3$, $Ta_2O_5$, ZrO, $SiO_2$, SiON, or a combination thereof, in accordance with some embodiments.

The strip structures 152, 154, and 156 are formed using a deposition process and a patterning process, in accordance with some embodiments. The deposition process includes a chemical vapor deposition (CVD) process, an atomic layer deposition (ALD) process, a physical vapor deposition (PVD) process, or a combination thereof, in accordance with some embodiments. The patterning process includes a photolithography process and an etching process, in accordance with some embodiments.

As shown in FIGS. 1B, 1B-1, 1B-2, and 1B-3, a spacer layer 160 conformally covers the strip structures 152, 154, and 156 and the mask layer 140, in accordance with some embodiments. The gap 154g in the strip structure 154 is filled with the spacer layer 160, in accordance with some embodiments. The spacer layer 160 has trenches 162a, 164a, 166a, and 168a, in accordance with some embodiments.

The trench 162a is between the strip structures 152 and 154, in accordance with some embodiments. The trench 164a is between the strip structures 154 and 156, in accordance with some embodiments. The trench 166a is adjacent to the strip structure 152, in accordance with some embodiments. The trench 168a is adjacent to the strip structure 156, in accordance with some embodiments.

As shown in FIG. 1B-1, the strip structure 152, 154, or 156 has a thickness T1, in accordance with some embodiments. The spacer layer 160 has a thickness T2, in accordance with some embodiments. In some embodiments, a ratio of the thickness T2 to the thickness T1 ranges from about 0.1 to about 0.5.

If the ratio is less than 0.1, a distance between the strip structures 152, 154, and 156 and strip structures subsequently formed in the trenches 162a, 164a, 166a, and 168a is too small to meet layout requirements, in accordance with some embodiments. If the ratio is greater than 0.5, the spacer layer 160 is too thick to form the trenches 162a, 164a, 166a, and 168a, in accordance with some embodiments.

The spacer layer 160 and the strip structures 152, 154, and 156 are made of different materials, in accordance with some embodiments. The spacer layer 160, the strip structures 152, 154, and 156, and the mask layer 140 are made of different materials, in accordance with some embodiments.

The spacer layer 160 is made of or includes a dielectric material, such as a nitride-containing material or an oxide-containing material, in accordance with some embodiments. The nitride-containing material includes SiON, SiCN, SiN, TiN, or a combination thereof, in accordance with some embodiments. The oxide-containing material includes HfO, $Al_2O_3$, $Ta_2O_5$, ZrO, $SiO_2$, SiON, or a combination thereof, in accordance with some embodiments.

The spacer layer 160 is formed using a deposition process, in accordance with some embodiments. The deposition process includes a chemical vapor deposition (CVD) process, an atomic layer deposition (ALD) process, a physical vapor deposition (PVD) process, or a combination thereof, in accordance with some embodiments.

FIG. 1C-3 is a cross-sectional view illustrating the semiconductor device structure along a sectional line in FIG. 1C, in accordance with some embodiments. As shown in FIGS. 1C, 1C-1, and 1C-3, a block structure 170 is formed in the trench 162a of the spacer layer 160, in accordance with some embodiments. The block structure 170 covers a portion 161 of the spacer layer 160, in accordance with some embodiments.

The block structure 170, the spacer layer 160, the strip structures 152, 154, and 156, and the mask layer 140 are made of different materials, in accordance with some embodiments. The block structure 170 is made of or includes an insulating material, such as a photoresist material, a polymer material, a nitride-containing material, or an oxide-containing material, in accordance with some embodiments.

The nitride-containing material includes SiON, SiCN, SiN, TiN, or a combination thereof, in accordance with some embodiments. The oxide-containing material includes HfO, $Al_2O_3$, $Ta_2O_5$, ZrO, $SiO_2$, SiON, or a combination thereof, in accordance with some embodiments.

In some embodiments, the formation of the block structure 170 includes performing a photolithography process to form the block structure 170, which is made of a photoresist material, such as a dry resist material. In some other embodiments, the formation of the block structure 170 includes performing a photolithography process to form a photoresist mask layer (not shown) over the spacer layer 160, and the photoresist mask layer has an opening exposing the spacer layer 160; forming the block structure 170 in the opening; and removing the photoresist mask layer. That is, the block structure 170 is formed by performing a backfill process using a reverse photoresist mask layer, in accordance with some embodiments.

As shown in FIGS. 1C, 1C-1, 1C-2, and 1C-3, a portion of the spacer layer 160, which is under the trenches 162a, 164a, 166a, and 168a and not covered by the block structure 170, and a portion of the spacer layer 160, which is over the strip structures 152, 154, and 156, are removed, in accordance with some embodiments.

The removal process forms trenches 162b, 162c, 164b, 166b, and 168b in the spacer layer 160, in accordance with some embodiments. The trenches 162b and 162c are under the trench 162a, in accordance with some embodiments. The trench 164b is under the trench 164a, in accordance with some embodiments. The trench 166b is under the trench 166a, in accordance with some embodiments. The trench 168b is under the trench 168a, in accordance with some embodiments.

The removal process includes an etching process, such as an anisotropic etching process (e.g., a dry etching process), in accordance with some embodiments. The dry etching process includes a plasma etching process, such as a reactive ion etch (RIE) plasma process, in accordance with some embodiments.

As shown in FIGS. 1C and 1C-1, a top surface 172 of the block structure 170 is lower than a top surface 163 of the spacer layer 160, in accordance with some embodiments. The top surface 172 of the block structure 170 is lower than a top surface 154c of the strip structure 154, in accordance with some embodiments. The top surface 172 of the block structure 170 is lower than top surfaces 152a of the strip structure 152, in accordance with some embodiments. The top surface 172 of the block structure 170 is lower than top surfaces 156a of the strip structure 156, in accordance with some embodiments.

After the removal process, the spacer layer 160 remains over sidewalls 152b and 152c of the strip structure 152, sidewalls 154d and 154e of the strip structure 154, sidewalls 156b and 156c of the strip structure 156, and under the block structure 170, in accordance with some embodiments. The portion 161 of the spacer layer 160 remaining under the block structure 170 connects the spacer layer 160 remaining over the sidewall 152c of the strip structure 152 to the spacer layer 160 remaining over the sidewall 154d of the strip structure 154, in accordance with some embodiments.

Figure 2A:
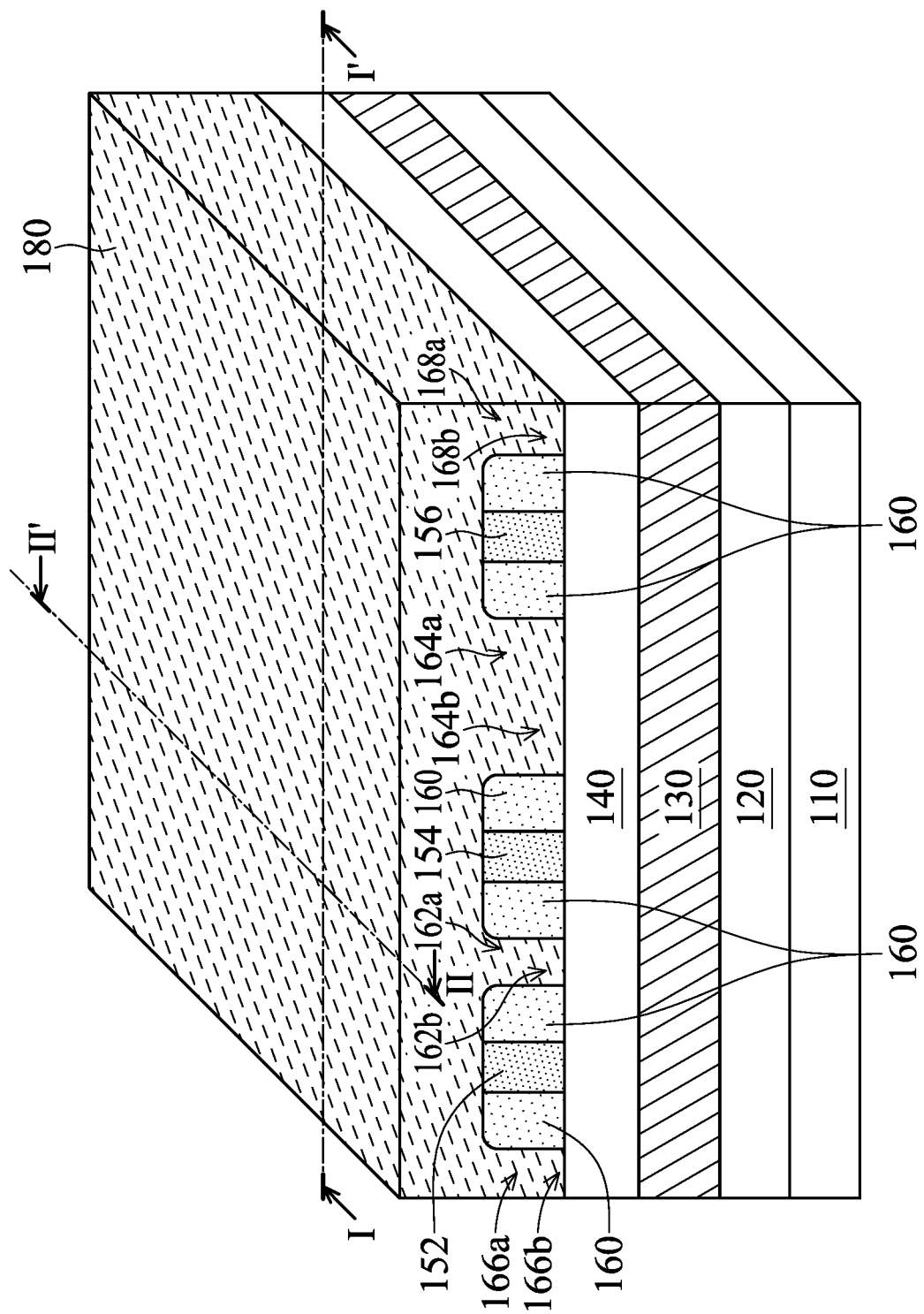
FIGS. 2A-2H are perspective views of various stages of a process for forming a semiconductor device structure, in accordance with some embodiments.
Figures 1, 2A:
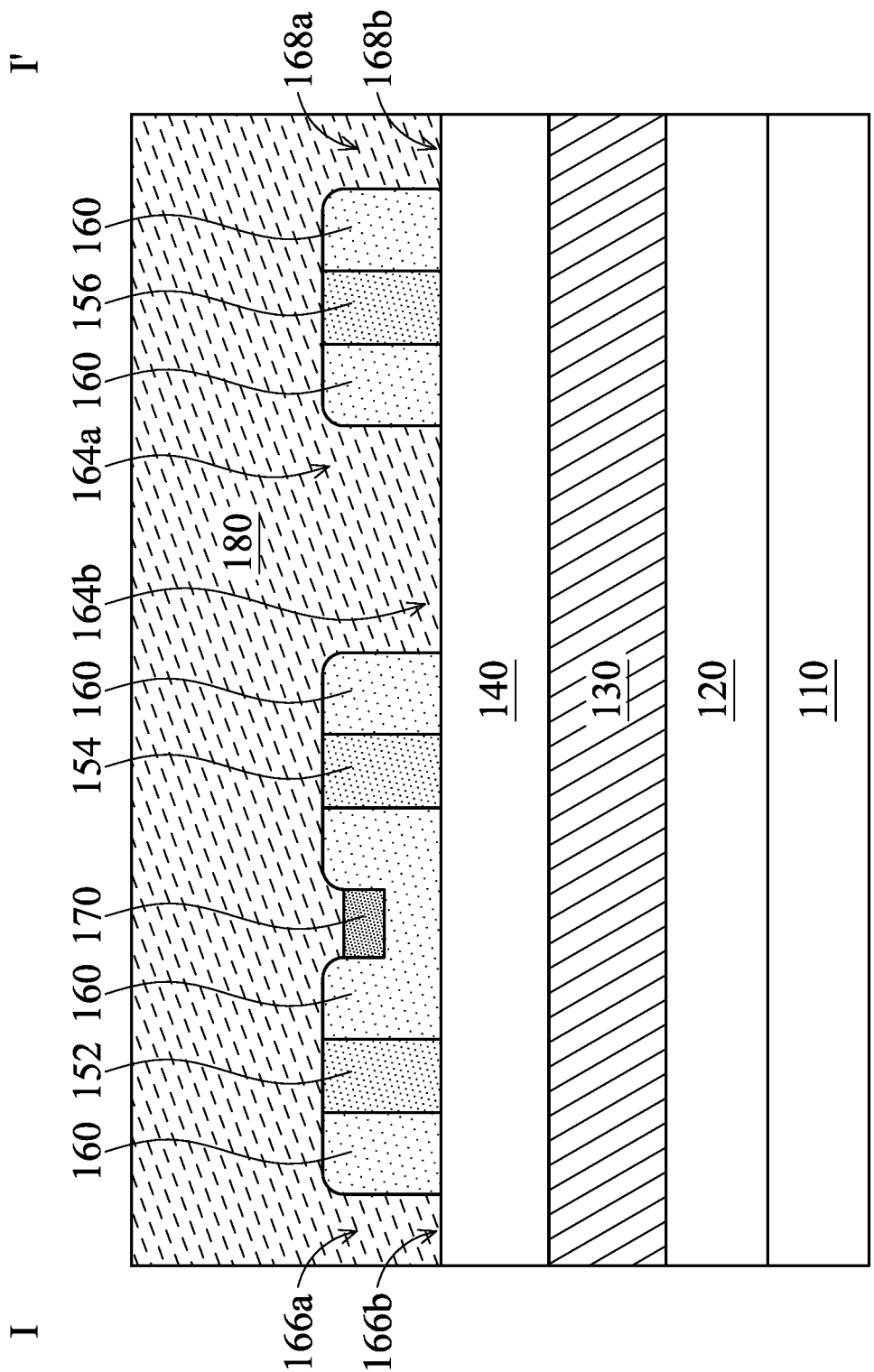
Figures 2, 2A:
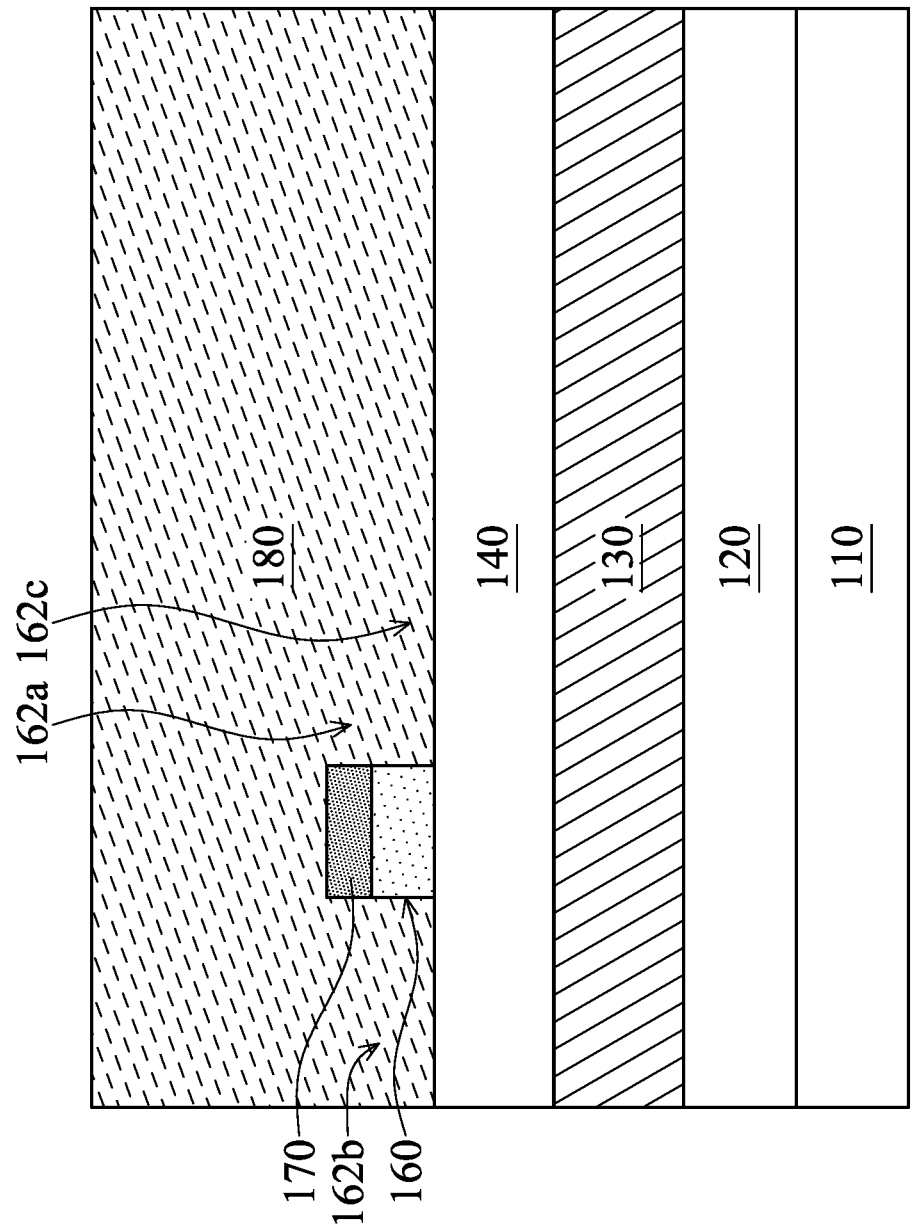
Figure 2B:
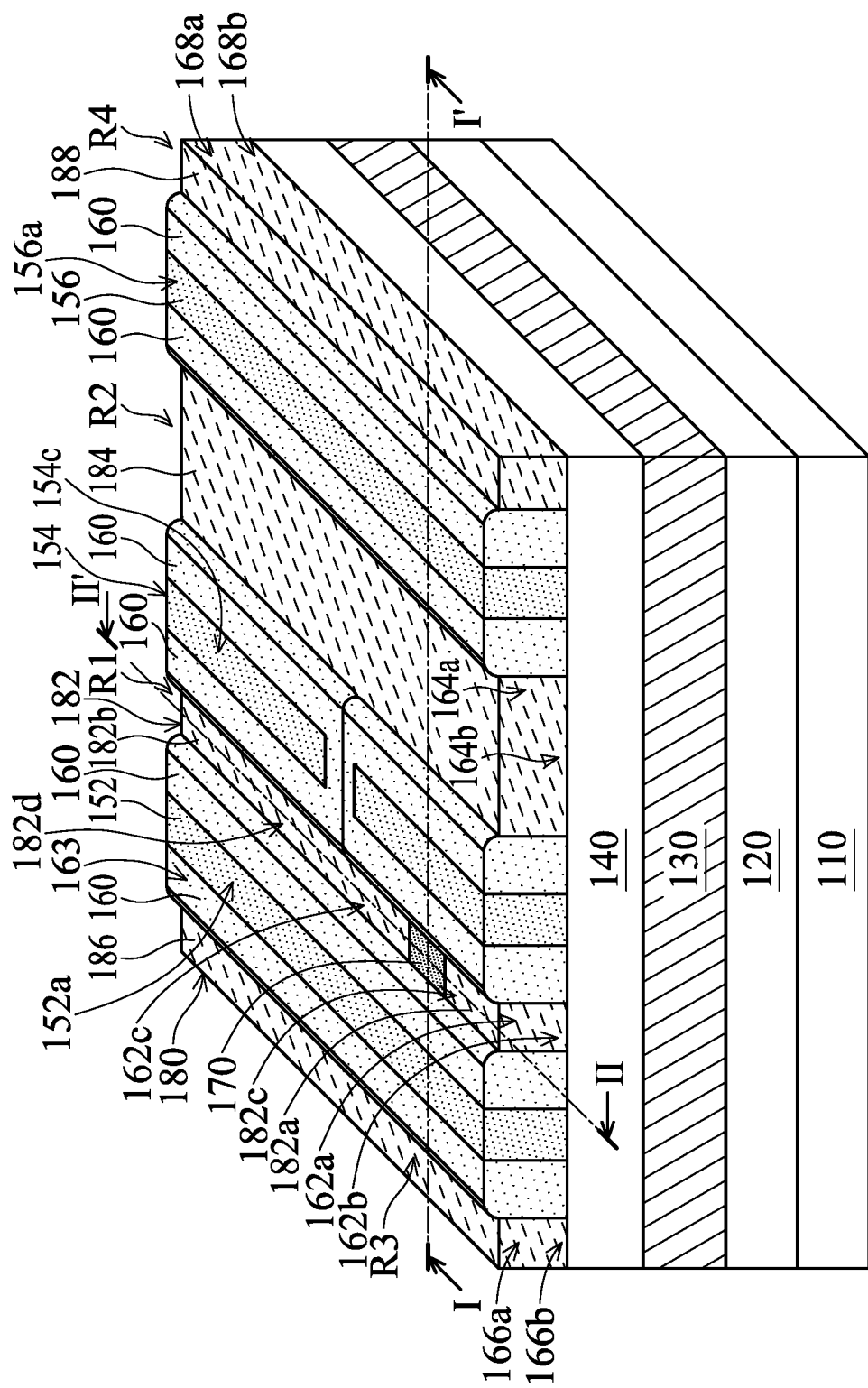
Figures 1, 2B:
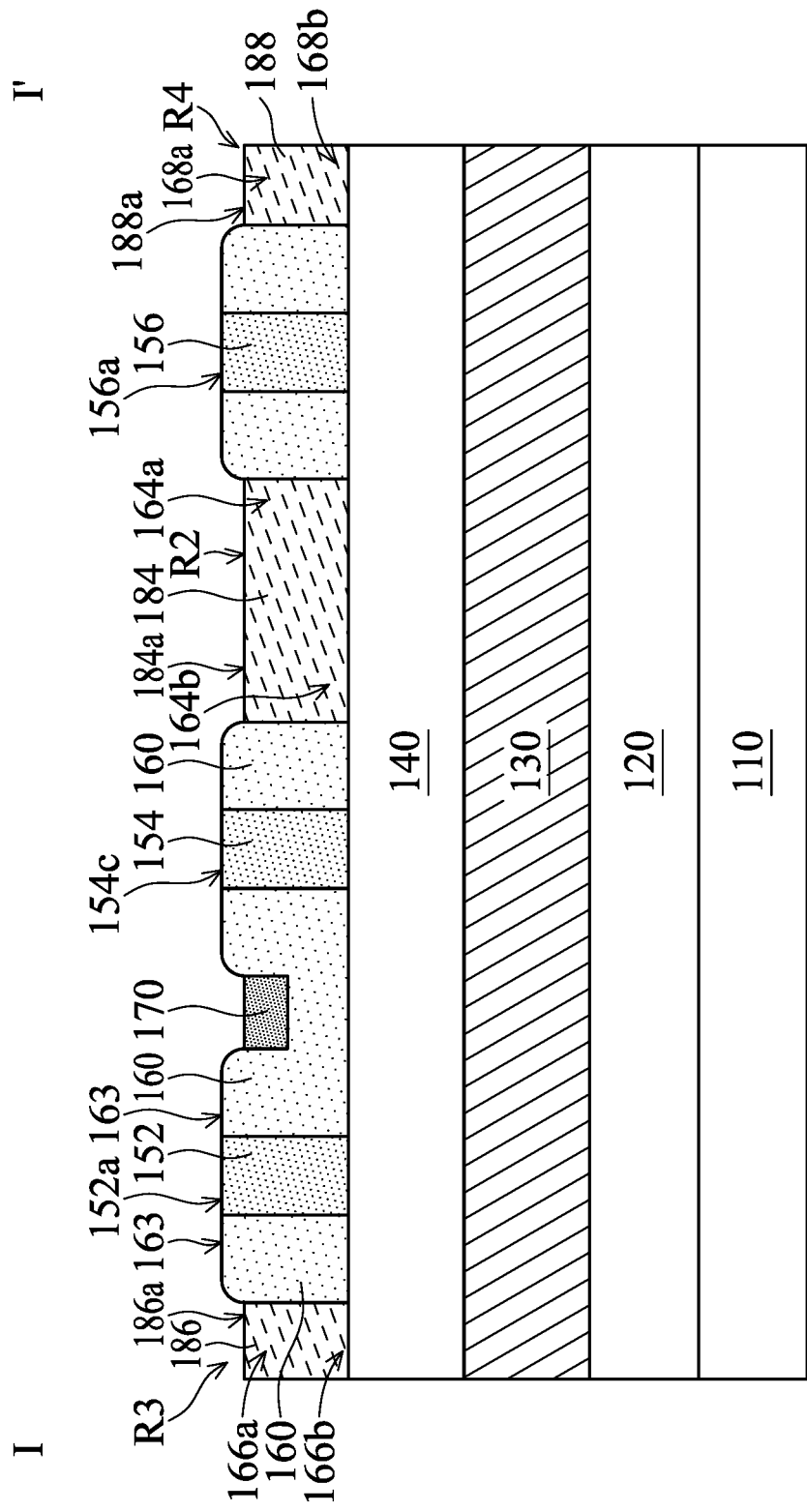
Figures 2, 2B:
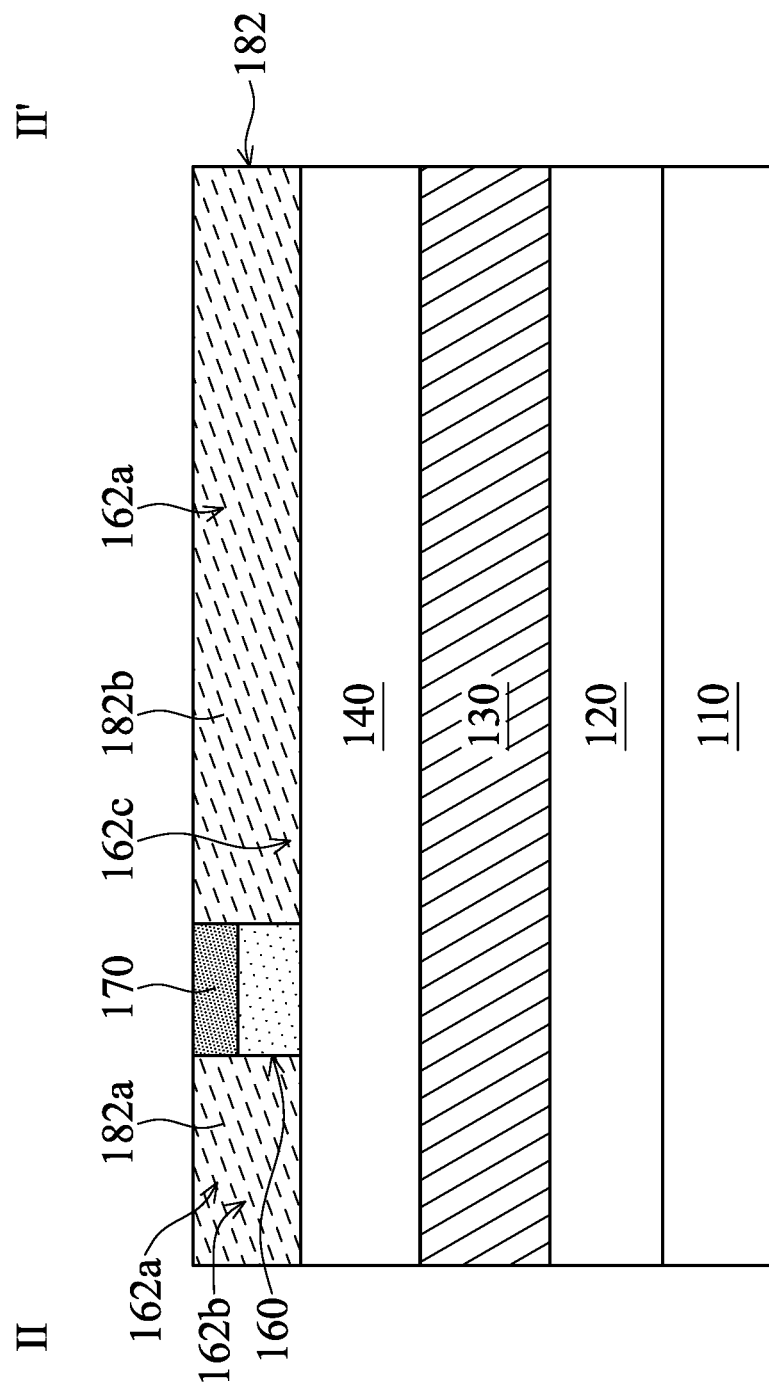
Figure 2C:
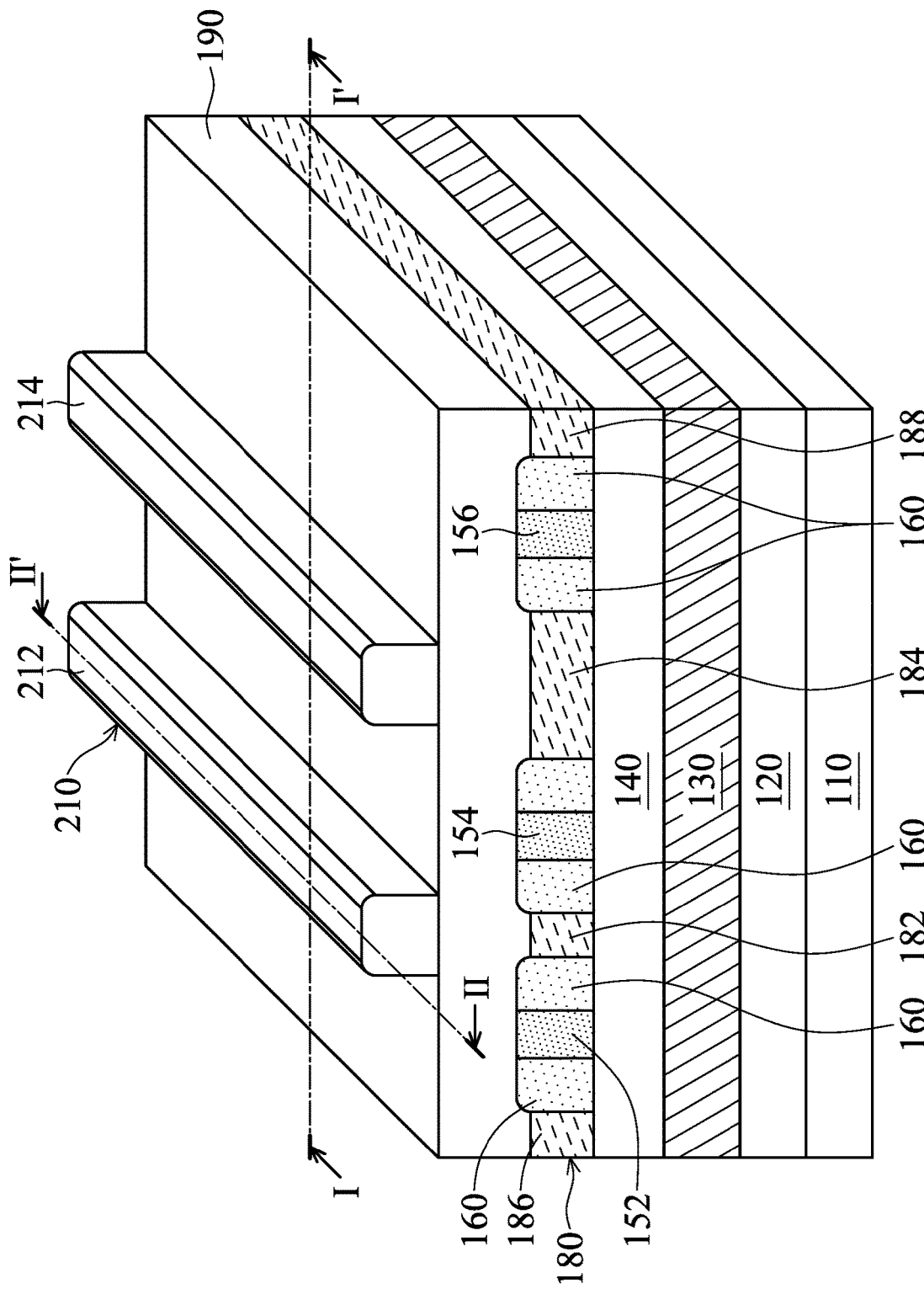
Figures 1, 2C:
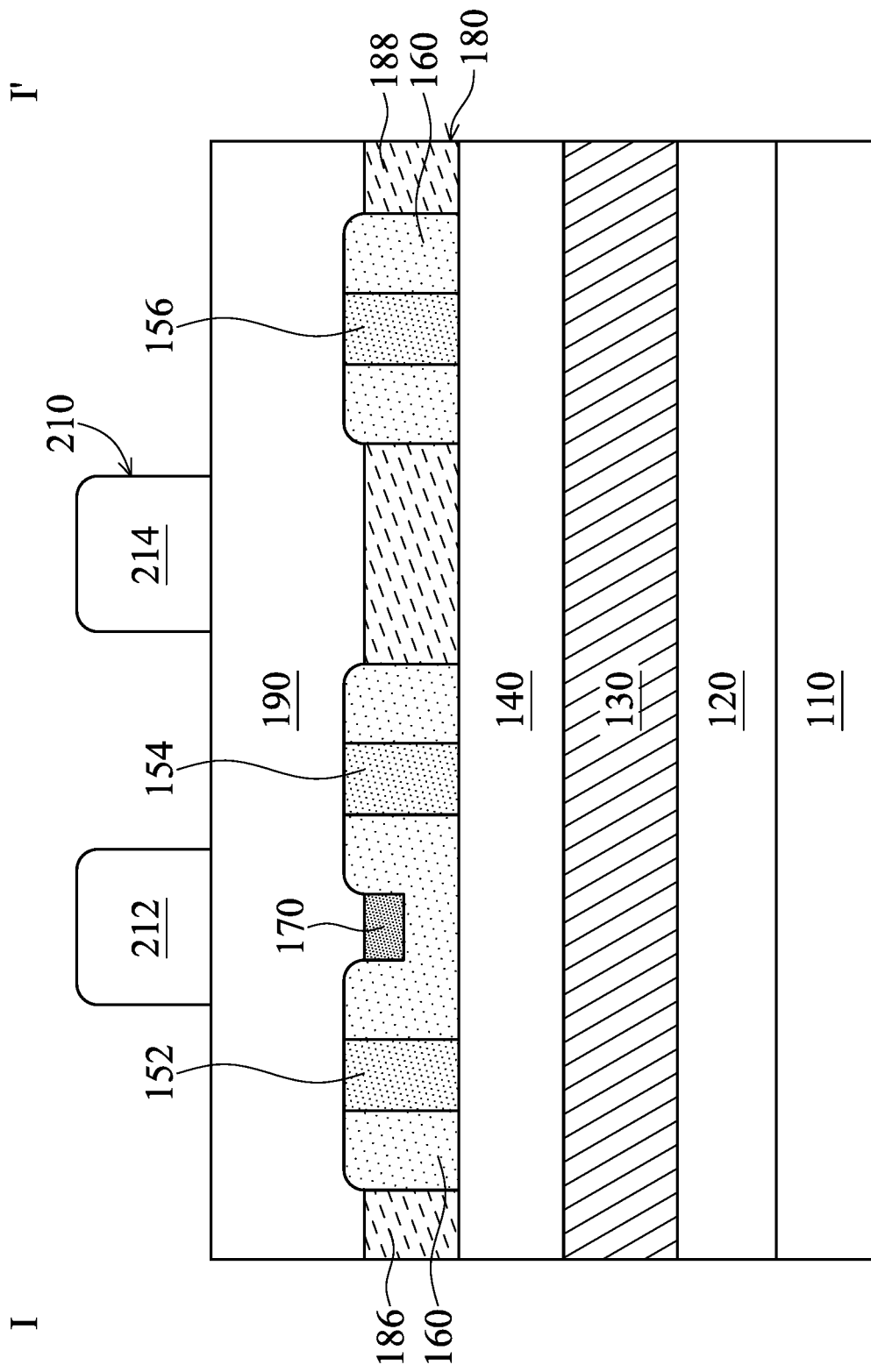
Figures 2, 2C:
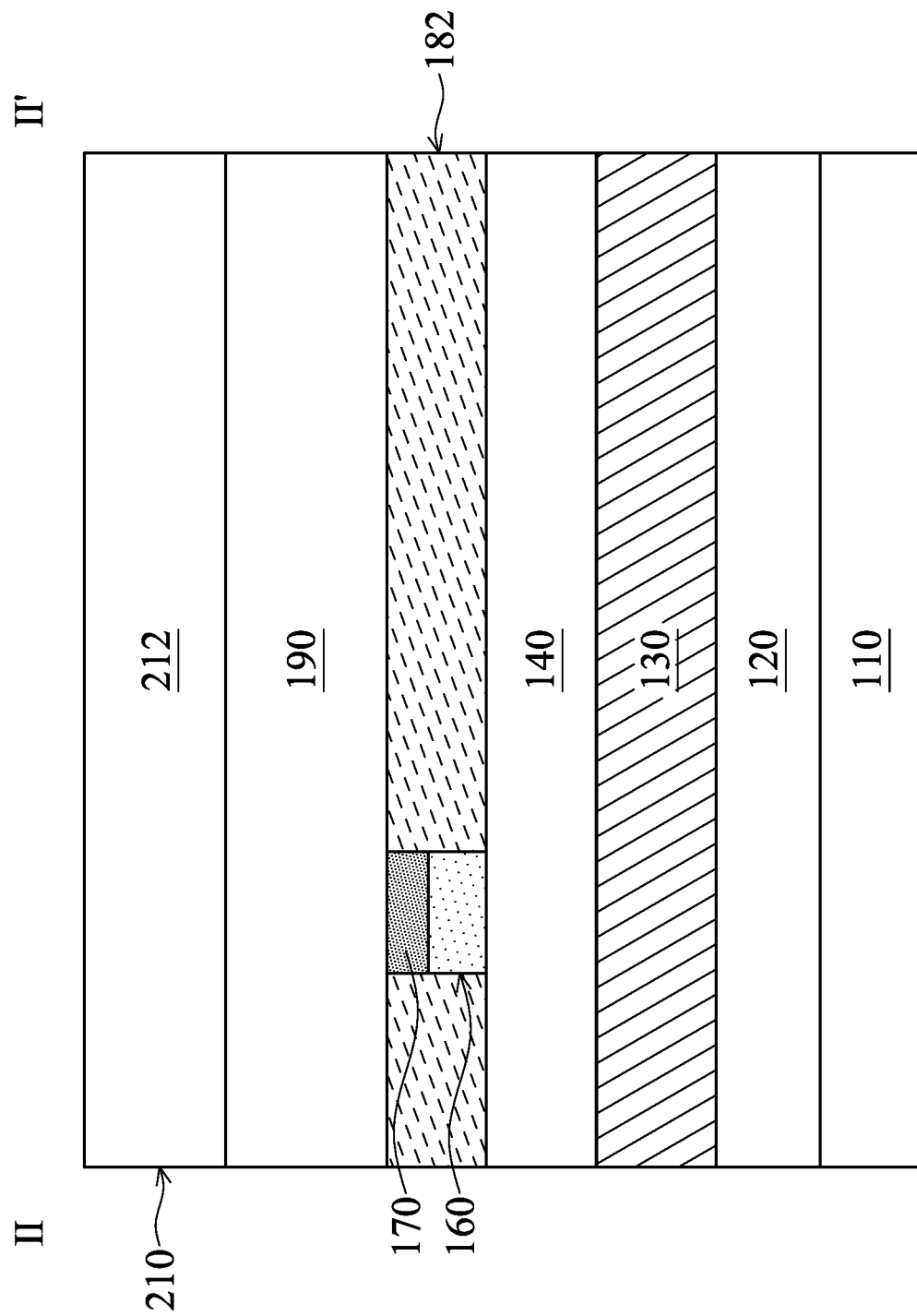
Figure 2D:
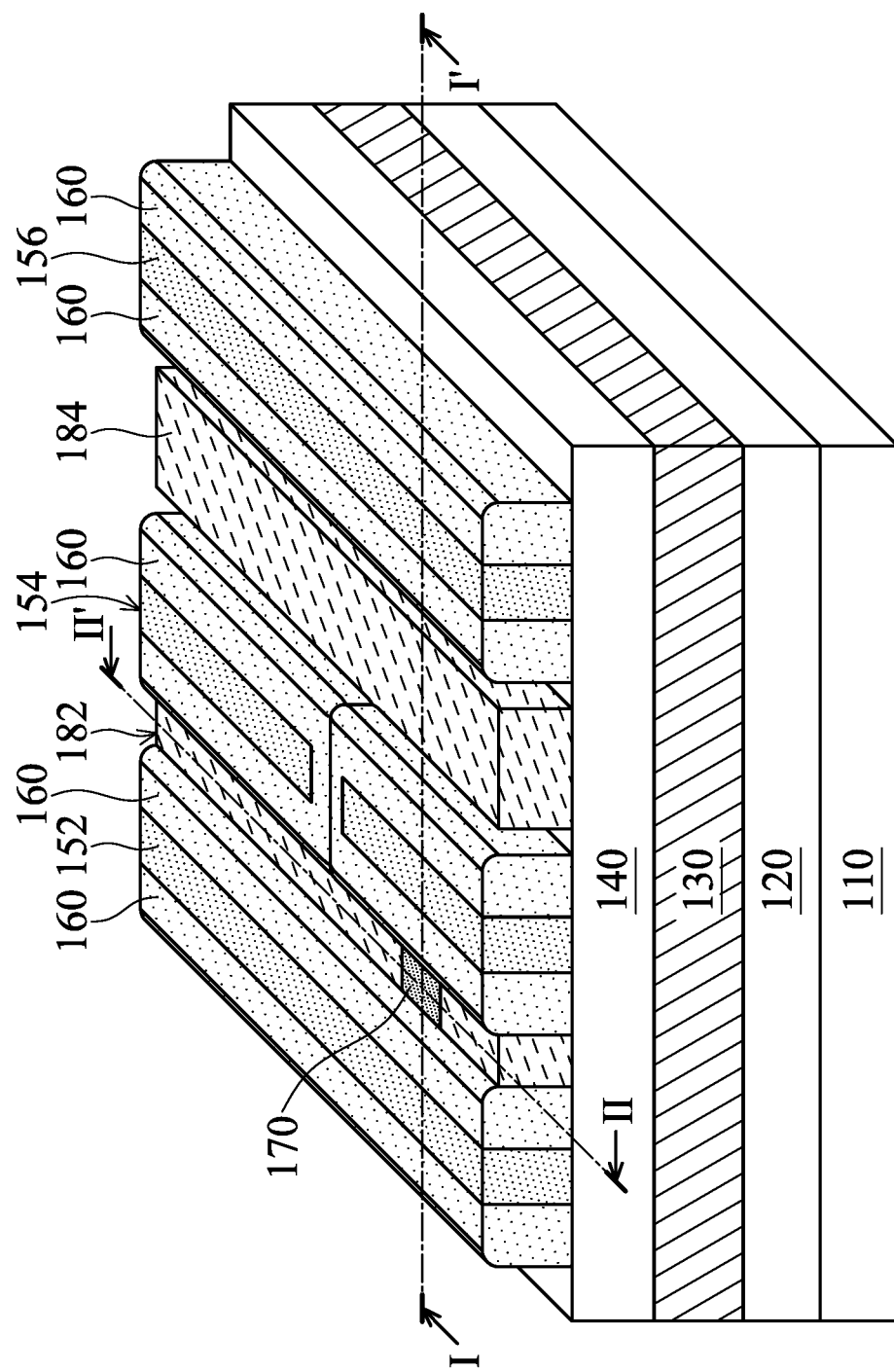
Figures 1, 2D:
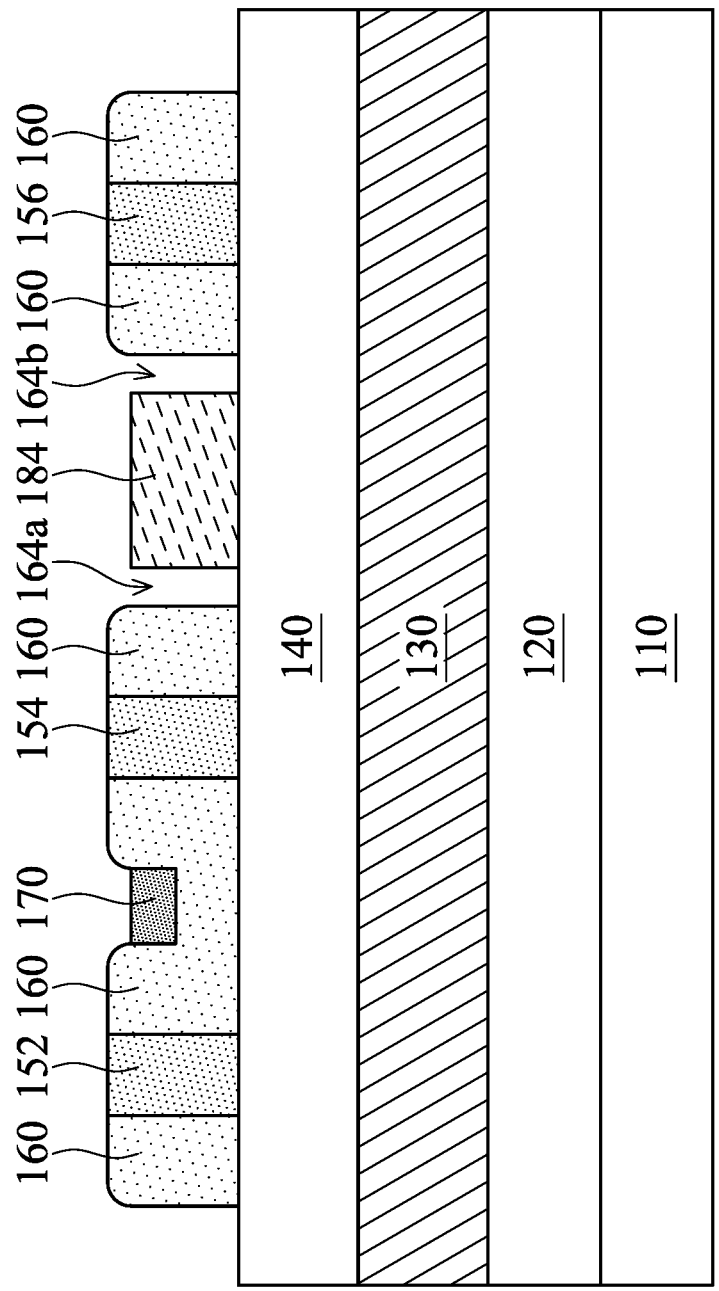
Figures 2, 2D:
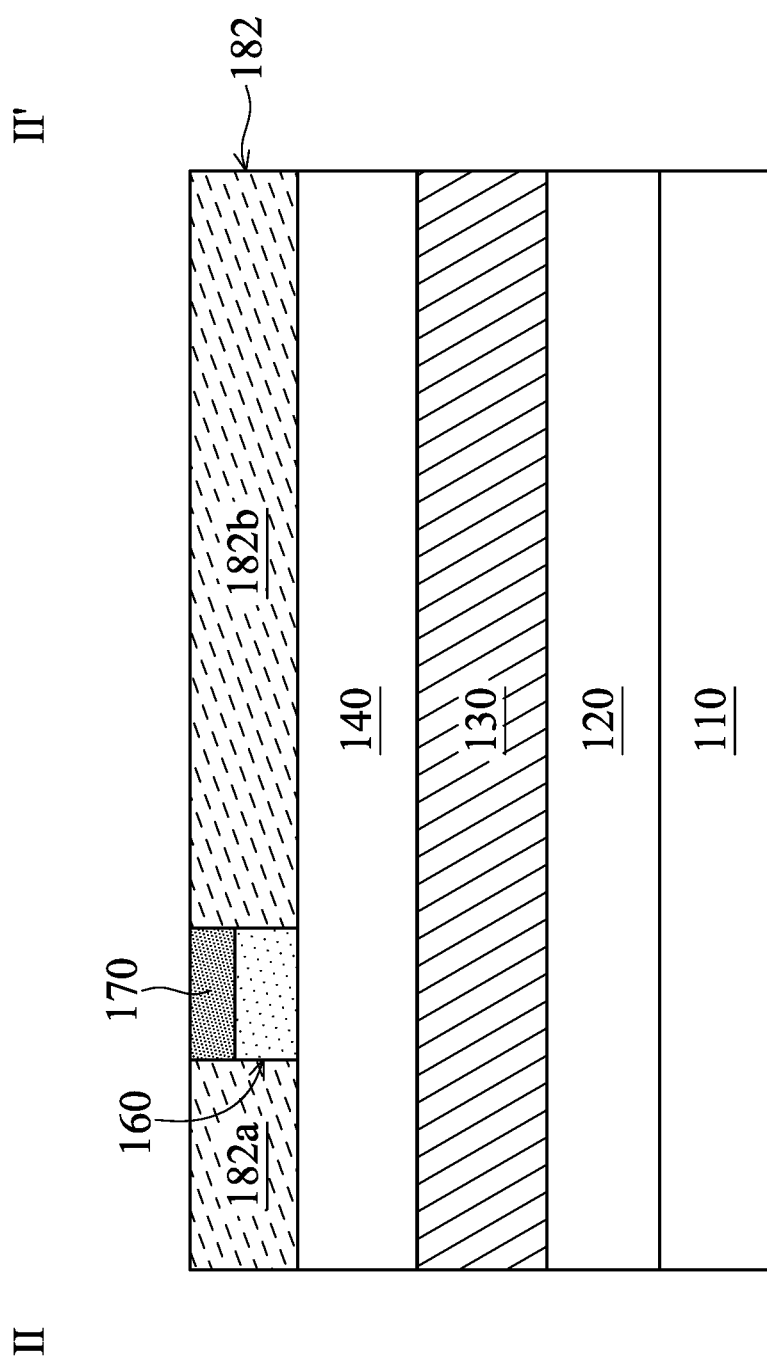
Figure 2E:
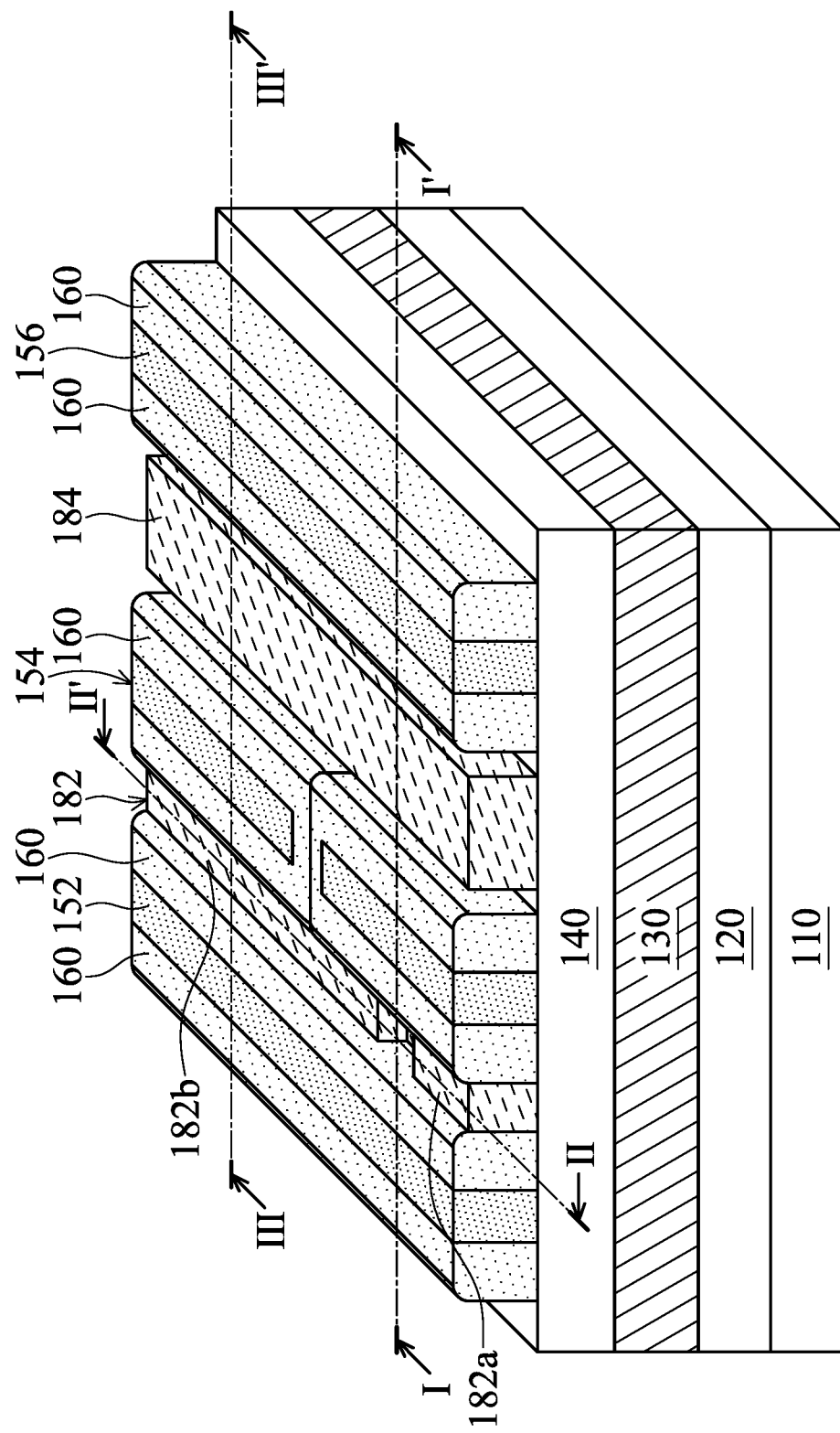
Figures 1, 2E:
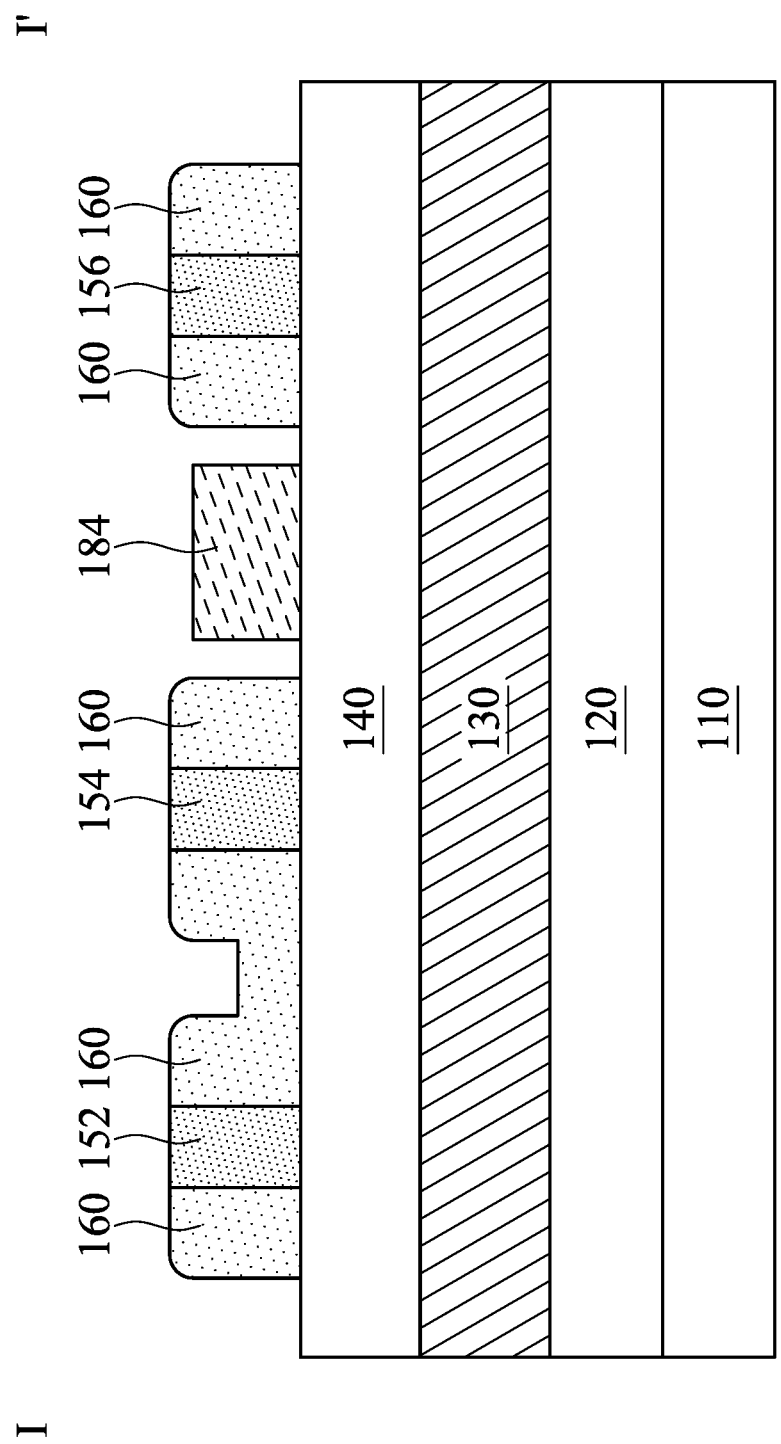
Figures 2, 2E:
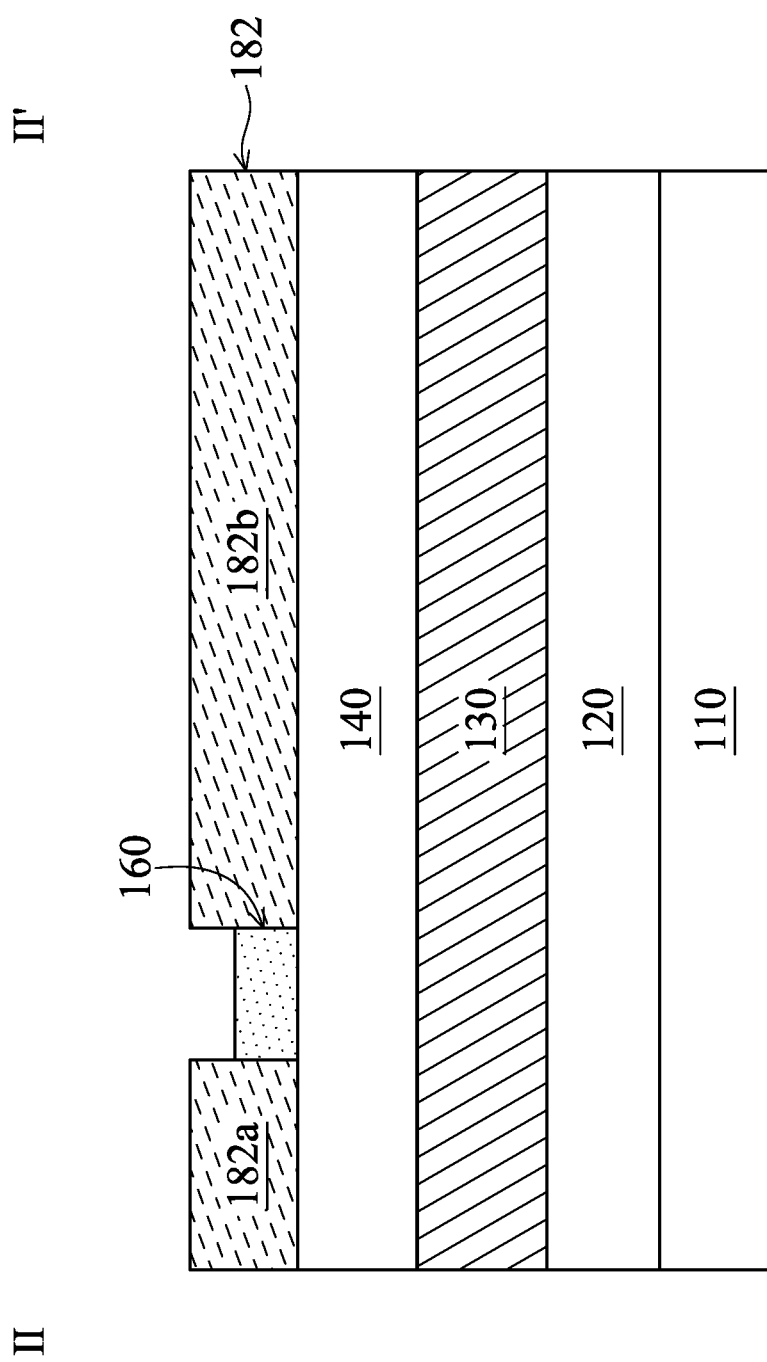
Figures 2, 2E, 3:
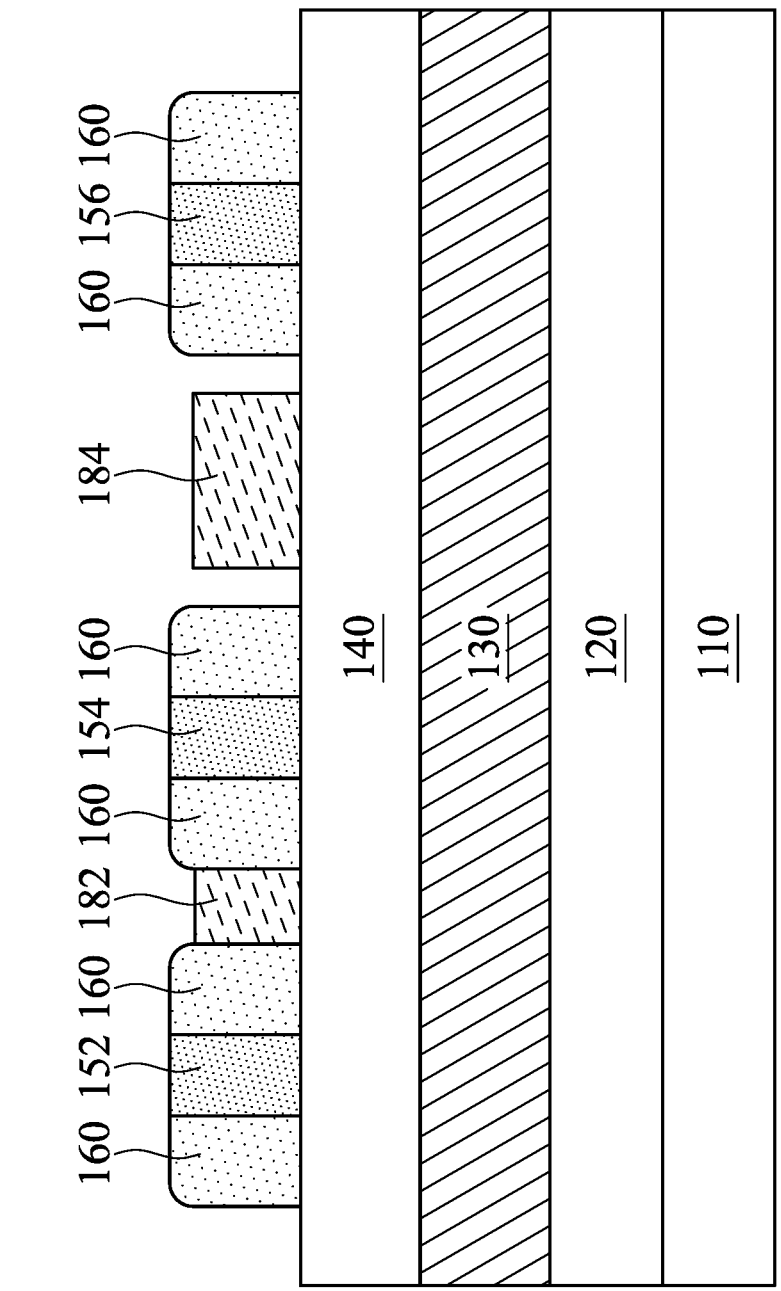
Figure 2F:
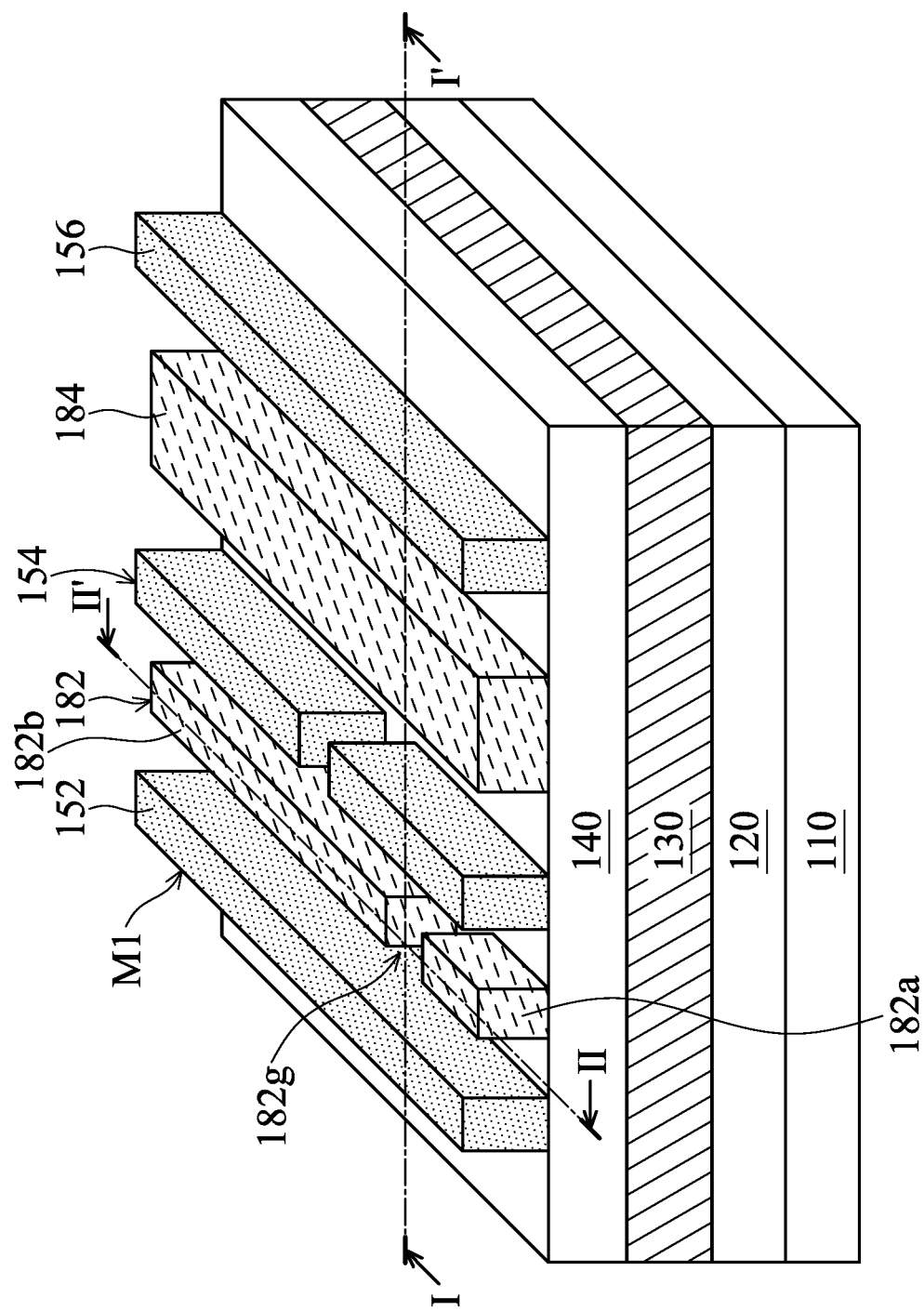
Figures 1, 2F:
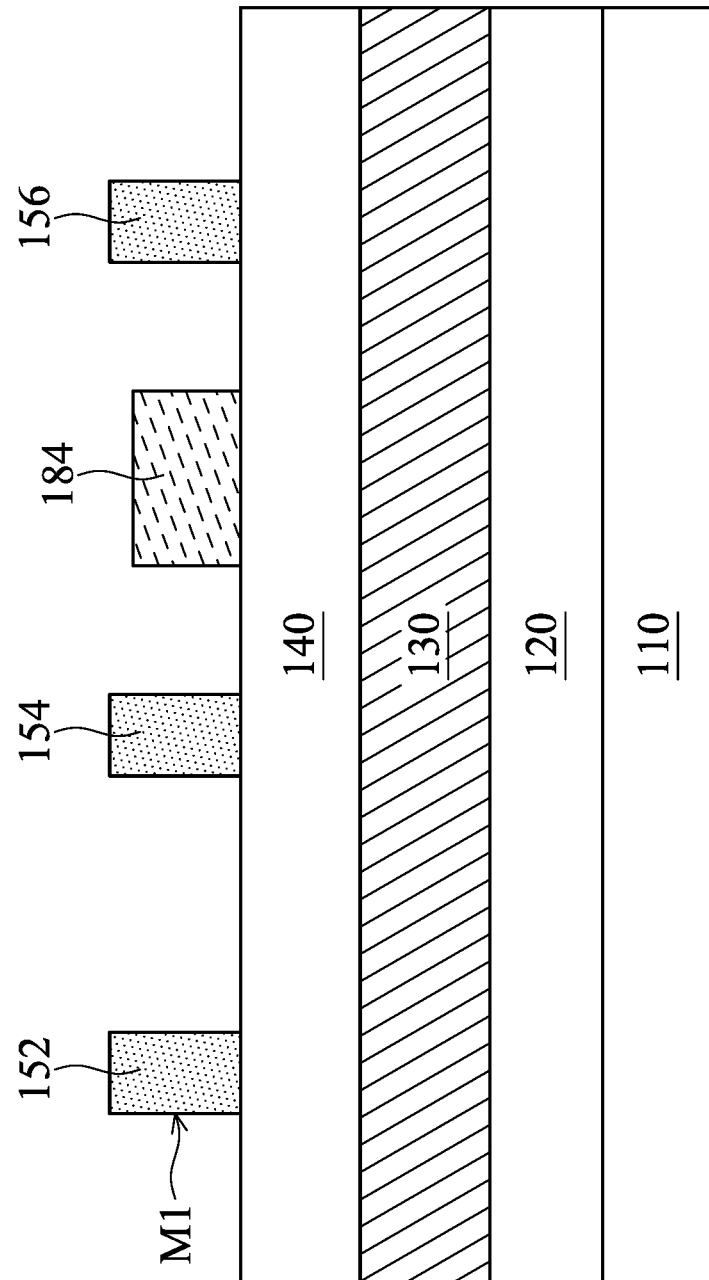
Figures 2, 2F:
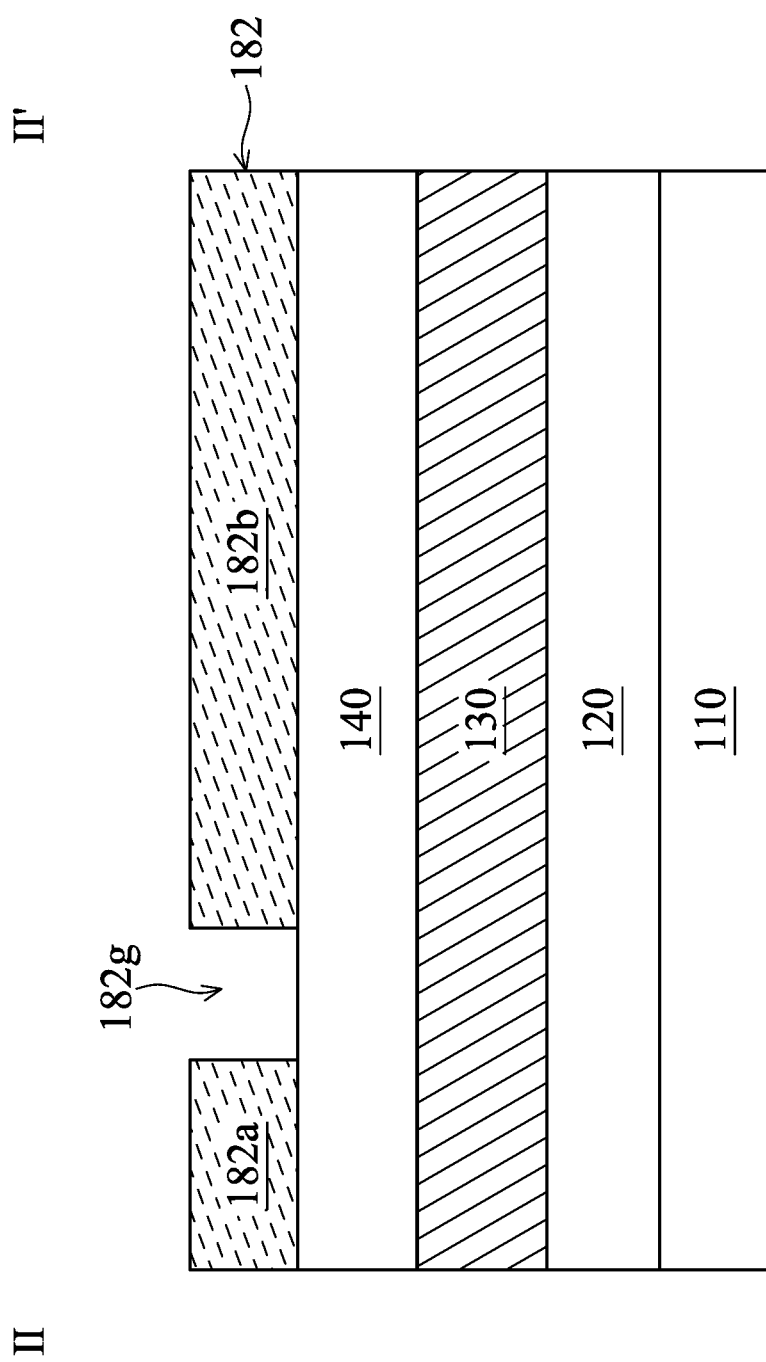
Figure 2G:
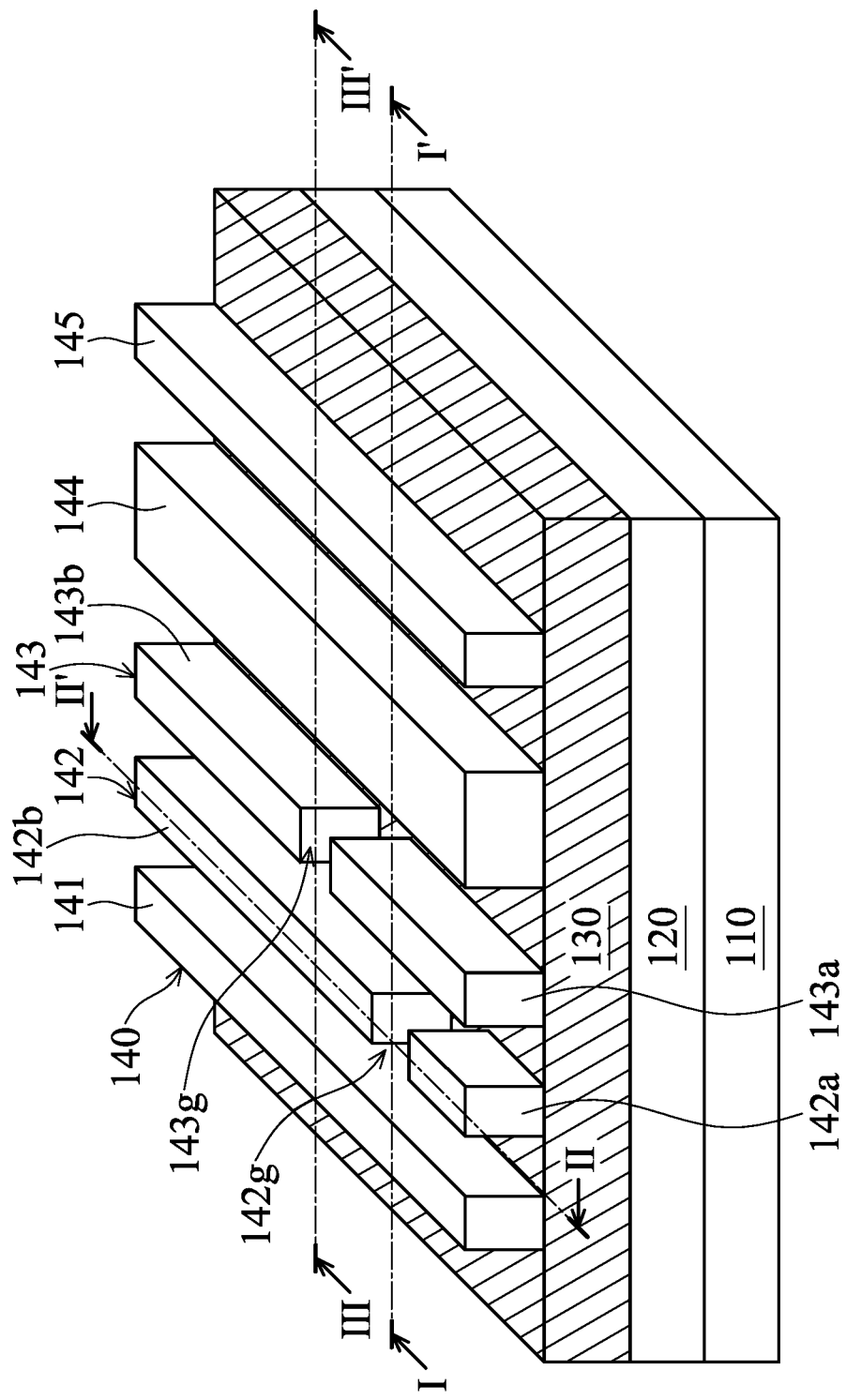
Figures 1, 2G:
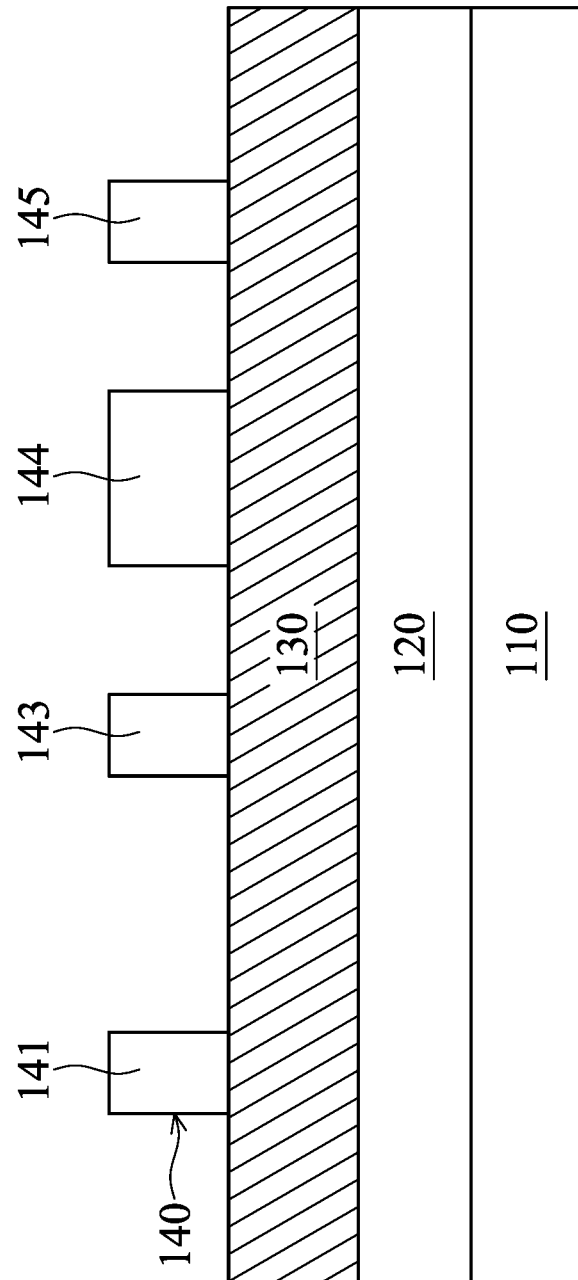
Figures 2, 2G:
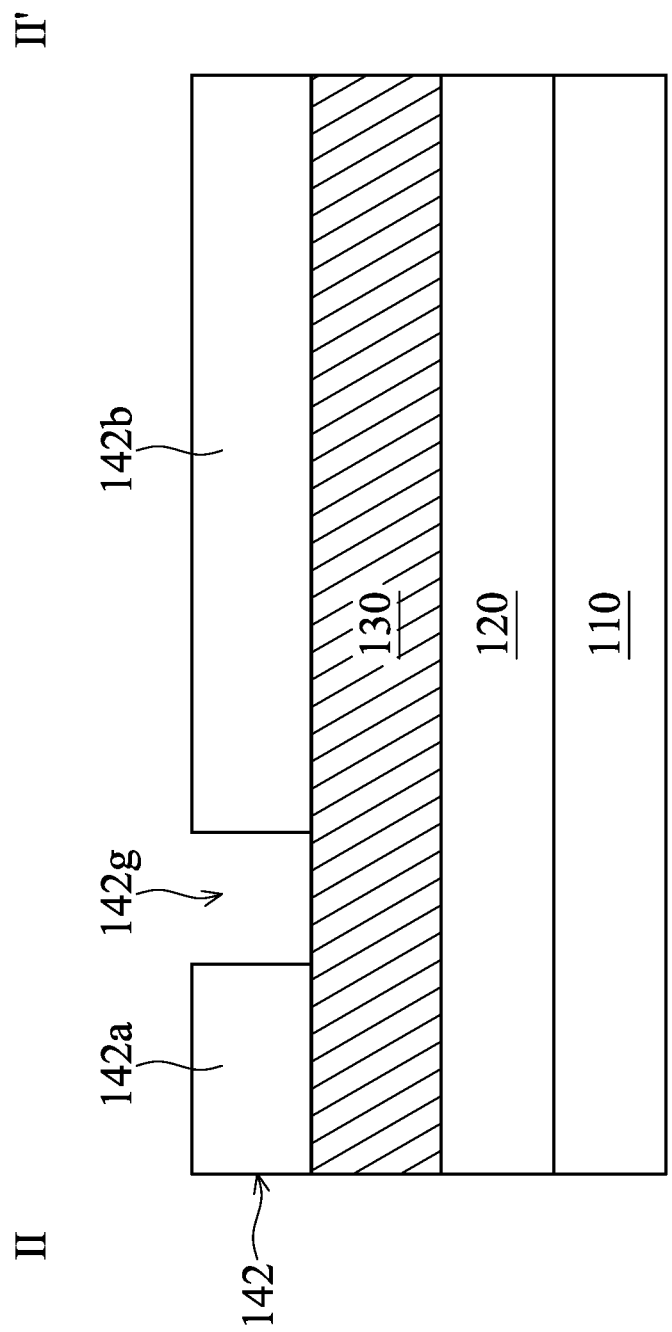
Figures 2, 2G, 3:
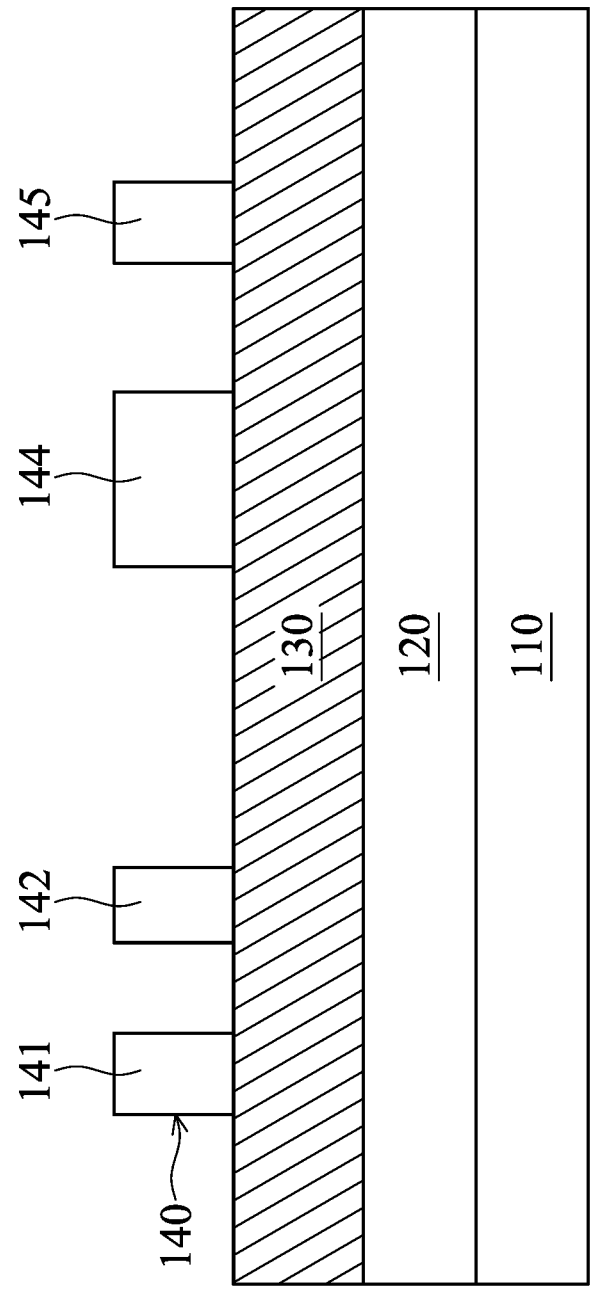
Figure 2H:
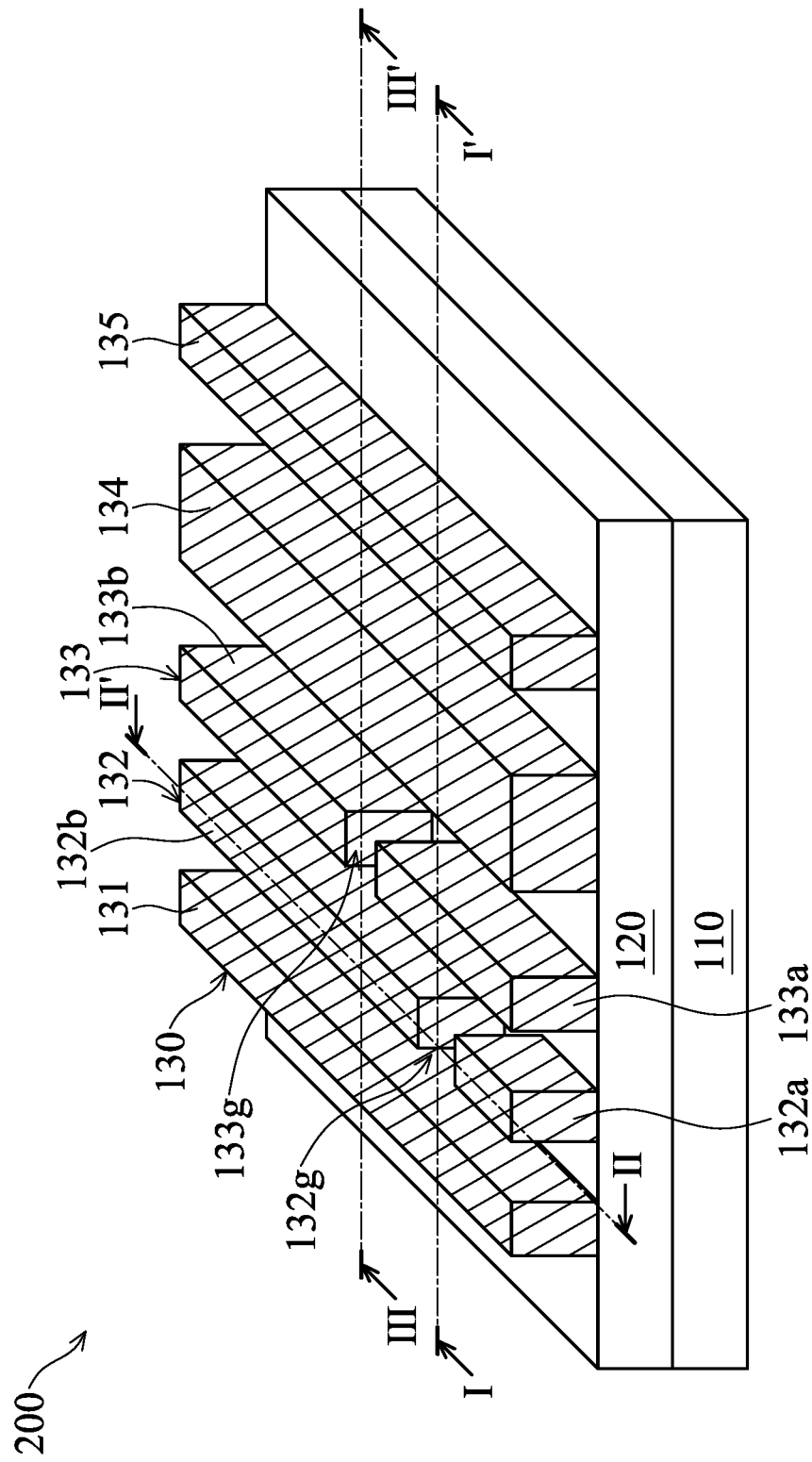
Figures 1, 2H:
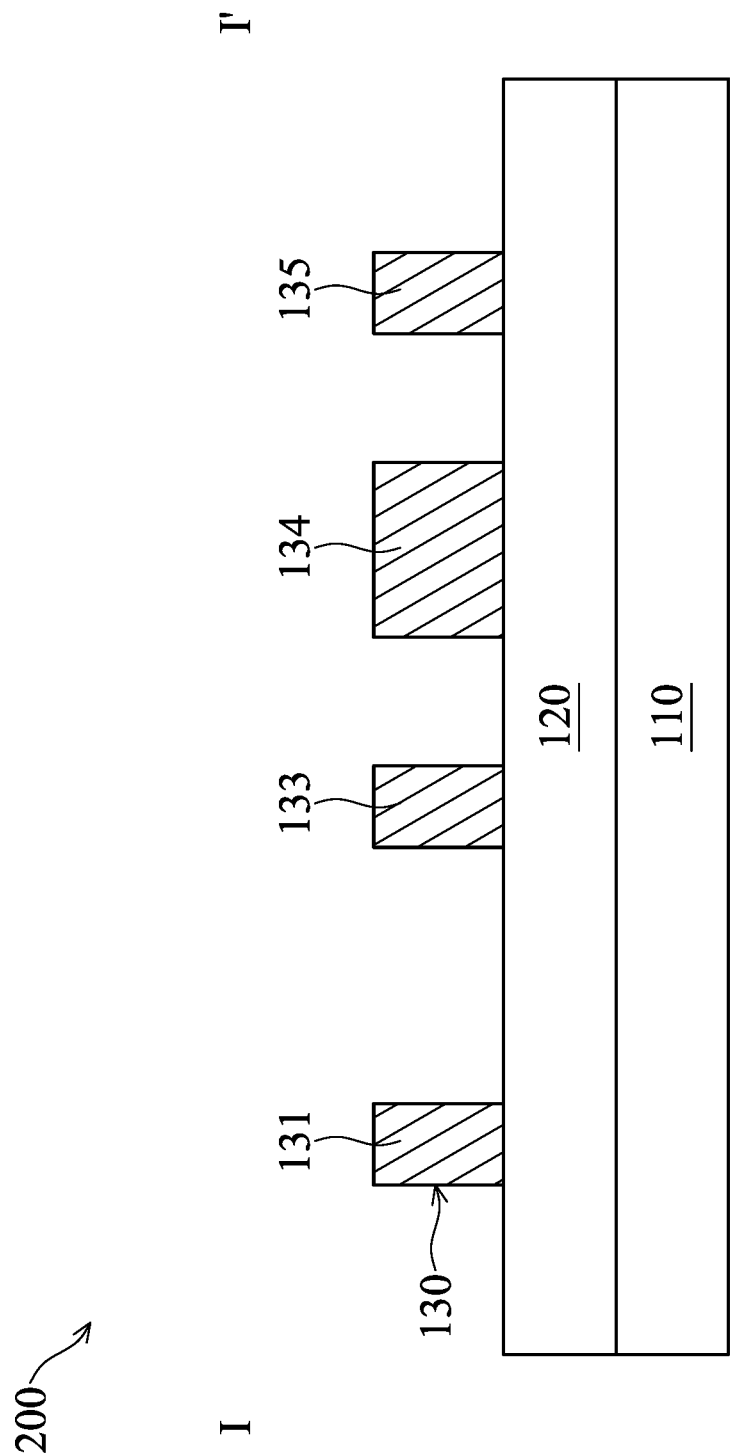
Figures 2, 2H, 3:
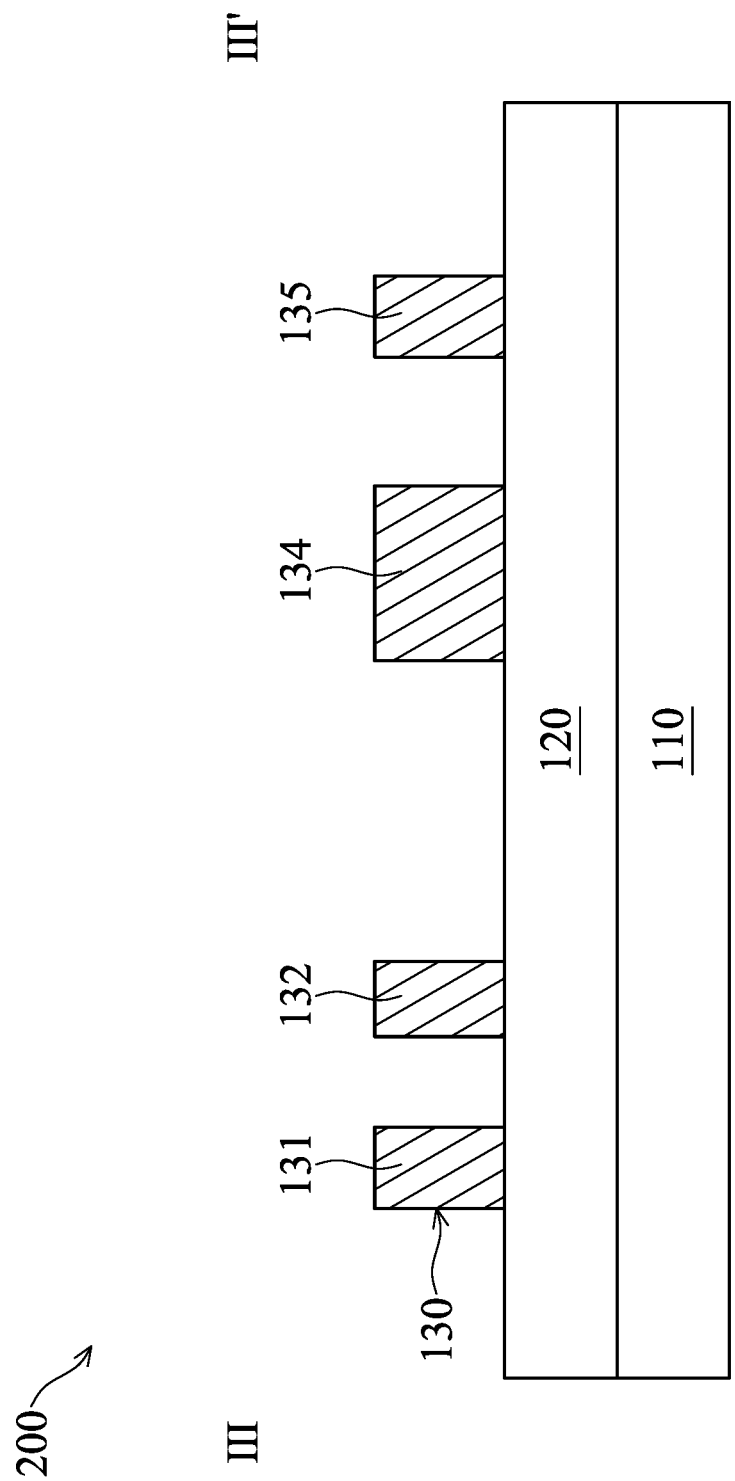

FIGS. 2A-2H are perspective views of various stages of a process for forming a semiconductor device structure, in accordance with some embodiments. FIGS. 2A-1 to 2H-1 are cross-sectional views illustrating the semiconductor device structure along sectional lines I-I' in FIGS. 2A-2H, in accordance with some embodiments. FIGS. 2A-2 to 2H-2 are cross-sectional views illustrating the semiconductor device structure along sectional lines II-II' in FIGS. 2A-2H, in accordance with some embodiments.

As shown in FIGS. 2A, 2A-1, and 2A-2, after the step of FIG. 1C, a layer 180 is formed over the spacer layer 160, the strip structures 152, 154, and 156, and the mask layer 140, in accordance with some embodiments. The trenches 162a, 162b, 162c, 164a, 164b, 166a, 166b, 168a, and 168b are filled with the layer 180, in accordance with some embodiments.

The layer 180, the block structure 170, the spacer layer 160, the strip structures 152, 154, and 156, and the mask layer 140 are made of different materials, in accordance with some embodiments. The layer 180 is made of or includes a dielectric material, such as a nitride-containing material or an oxide-containing material, in accordance with some embodiments.

The nitride-containing material includes SiON, SiCN, SiN, TiN, or a combination thereof, in accordance with some embodiments. The oxide-containing material includes HfO, $Al_2O_3$, $Ta_2O_5$, ZrO, $SiO_2$, SiON, or a combination thereof, in accordance with some embodiments.

The layer 180 is formed using a deposition process, in accordance with some embodiments. The deposition process includes a chemical vapor deposition (CVD) process, an atomic layer deposition (ALD) process, a physical vapor deposition (PVD) process, or a combination thereof, in accordance with some embodiments. The chemical vapor deposition process includes a flowable chemical vapor deposition process, in accordance with some embodiments.

As shown in FIGS. 2B, 2B-1, and 2B-2, a top portion of the layer 180 is removed, in accordance with some embodiments. After the removal process, the layer 180 includes strip structures 182, 184, 186, and 188, in accordance with some embodiments. The strip structure 182 is in the trenches 162a, 162b, and 162c, in accordance with some embodiments. The strip structure 182 has parts 182a and 182b respectively in the trenches 162b and 162c, in accordance with some embodiments.

The strip structure 184 is in the trenches 164a and 164b, in accordance with some embodiments. The strip structure 186 is in the trenches 166a and 166b, in accordance with some embodiments. The strip structure 188 is in the trenches 168a and 168b, in accordance with some embodiments.

As shown in FIGS. 2B and 2B-1, the removal process forms recesses R1, R2, R3, and R4 respectively over the strip structures 182, 184, 186, and 188, in accordance with some embodiments. As shown in FIGS. 2B and 2B-1, top surfaces 182c and 182d of the parts 182a and 182b of the strip structure 182 is lower than the top surfaces 152a, 154c, 156a, and 163 of the strip structures 152, 154, and 156 and the spacer layer 160, in accordance with some embodiments. The top surfaces 184a of the strip structure 184 is lower than the top surfaces 152a, 154c, 156a, and 163 of the strip structures 152, 154, and 156 and the spacer layer 160, in accordance with some embodiments.

The top surfaces 186a of the strip structure 186 is lower than the top surfaces 152a, 154c, 156a, and 163 of the strip structures 152, 154, and 156 and the spacer layer 160, in accordance with some embodiments. The top surfaces 188a of the strip structure 188 is lower than the top surfaces 152a, 154c, 156a, and 163 of the strip structures 152, 154, and 156 and the spacer layer 160, in accordance with some embodiments.

The removal process includes a planarization process and an etching process, in accordance with some embodiments. The planarization process includes performing a chemical mechanical polishing process over the layer 180 to remove the top portion of the layer 180 until exposing the strip structures 152, 154, and 156 and the spacer layer 160, in accordance with some embodiments. The etching process includes a dry etching process or a wet etching process, in accordance with some embodiments.

As shown in FIGS. 2C, 2C-1, and 2C-2, a layer 190 is formed over the strip structures 152, 154, and 156, the spacer layer 160, and the strip structures 182, 184, 186, and 188, in accordance with some embodiments. The layer 190 is made of a polymer material, a silicon-containing material (e.g., a silicon-containing polymer material), or another suitable material. The layer 190 is formed by a coating process, a CVD process, or another suitable process.

As shown in FIGS. 2C, 2C-1, and 2C-2, a photoresist layer 210 is formed over the layer 190, in accordance with some embodiments. The photoresist layer 210 includes strip structures 212 and 214, in accordance with some embodiments. The strip structure 212 is over the strip structure 182, in accordance with some embodiments. The strip structure 214 is over the strip structure 184, in accordance with some embodiments.

As shown in FIGS. 2C, 2D, and 2D-1, portions of the layer 190 and the layer 180, which are not covered by the photoresist layer 210, are removed, in accordance with some embodiments. The removal process removes side portions of the strip structure 184 to narrow the strip structure 184, in accordance with some embodiments. The removal process removes the strip structures 186 and 188, in accordance with some embodiments.

As shown in FIGS. 2D and 2D-1, the strip structure 184 is narrower than the trenches 164a and 164b after removing the side portions of the strip structure 184, in accordance with some embodiments. The removal process includes an etching process, such as an anisotropic etching process (e.g., a dry etching process), in accordance with some embodiments.

As shown in FIGS. 2D, 2D-1, and 2D-2, the layer 190 and the photoresist layer 210 are removed, in accordance with some embodiments. The removal process includes an etching process, such as a dry etching process or a wet etching process, in accordance with some embodiments.

FIG. 2E-3 is a cross-sectional view illustrating the semiconductor device structure along a sectional line in FIG. 2E, in accordance with some embodiments. As shown in FIGS. 2E, 2E-1, 2E-2, and 2E-3, the block structure 170 is removed, in accordance with some embodiments. The removal process includes an etching process, such as a dry etching process or a wet etching process, in accordance with some embodiments.

As shown in FIGS. 2F, 2F-1, and 2F-2, the spacer layer 160 is removed, in accordance with some embodiments. The strip structure 182 has a gap 182g, in accordance with some embodiments. The strip structures 152, 154, 156, 182, and 184 together form a patterned mask layer M1, in accordance with some embodiments.

The strip structures 152, 154, 156, 182, and 184 are parallel to each other, in accordance with some embodiments. The removal process includes an etching process, such as a dry etching process or a wet etching process, in accordance with some embodiments.

The application forms the strip structures 182 and 184 respectively between the strip structures 152, 154, and 156 by forming the spacer layer 160, in accordance with some embodiments. The distance between the strip structure 182 and the adjacent strip structures 152 and 154 and the distance between the strip structure 184 and the adjacent strip structures 154 and 156 are adjustable by adjusting the thickness T2 of the spacer layer 160 (as shown in FIG. 1B-1), in accordance with some embodiments.

Therefore, the distance between the strip structure 182 and the adjacent strip structures 152 and 154 and the distance between the strip structure 184 and the adjacent strip structures 154 and 156 may be reduced by reducing the thickness T2 of the spacer layer 160.

The application forms the gap 182g in the strip structure 182 by forming the block structure 170 over the spacer layer 160 to define the position of the gap 182g, in accordance with some embodiments. Therefore, there is no need to perform an additional patterning process (including a photolithography process and an etching process) to form the gap 182g in the strip structure 182, which saves the process cost and shortens the process time.

The patterned mask layer M1 is used as a conductive line mask layer, in accordance with some embodiments. Therefore, the distance between conductive lines formed by using the patterned mask layer M1 is adjustable by adjusting the thickness T2 of the spacer layer 160, in accordance with some embodiments.

Since the strip structure 182 has the gap 182g, one of the conductive lines formed by using the patterned mask layer M1 also has a gap, in accordance with some embodiments.

Therefore, there is no need to perform an additional patterning process (including a photolithography process and an etching process) over the conductive lines to form the gap in the one of the conductive lines, which saves the process cost and shortens the process time, in accordance with some embodiments.

FIGS. 2G-3 to 2H-3 are cross-sectional views illustrating the semiconductor device structure along sectional lines in FIGS. 2G-2H, in accordance with some embodiments. As shown in FIGS. 2G, 2G-1, 2G-2, and 2G-3, portions of the mask layer 140, which are not covered by the patterned mask layer M1, are removed, in accordance with some embodiments.

After the removal process, the mask layer 140 includes strip structures 141, 142, 143, 144, and 145, in accordance with some embodiments. The strip structures 141, 142, 143, 144, and 145 are parallel to each other, in accordance with some embodiments. The strip structure 142 has parts 142a and 142b, in accordance with some embodiments. The parts 142a and 142b are spaced apart from each other by a gap 142g, in accordance with some embodiments.

The strip structure 143 has parts 143a and 143b, in accordance with some embodiments. The parts 143a and 143b are spaced apart from each other by a gap 143g, in accordance with some embodiments. The removal process includes an etching process, such as an anisotropic etching process (e.g., a dry etching process), in accordance with some embodiments.

As shown in FIGS. 2G, 2G-1, 2G-2, and 2G-3, the patterned mask layer M1 is removed, in accordance with some embodiments. The removal process includes an etching process, such as a dry etching process or a wet etching process, in accordance with some embodiments.

As shown in FIGS. 2H, 2H-1, 2H-2, and 2H-3, portions of the layer 130, which are not covered by the mask layer 140, are removed, in accordance with some embodiments. After the removal process, the layer 130 includes strip structures 131, 132, 133, 134, and 135, in accordance with some embodiments. The strip structures 131, 132, 133, 134, and 135 are also referred to as conductive lines, in accordance with some embodiments.

The strip structures 131, 132, 133, 134, and 135 are parallel to each other, in accordance with some embodiments. The strip structure 132 has parts 132a and 132b, in accordance with some embodiments. The parts 132a and 132b are spaced apart from each other by a gap 132g, in accordance with some embodiments. The strip structure 133 has parts 133a and 133b, in accordance with some embodiments.

The parts 133a and 133b are spaced apart from each other by a gap 133g, in accordance with some embodiments. The removal process includes an etching process, such as an anisotropic etching process (e.g., a dry etching process), in accordance with some embodiments.

As shown in FIG. 2H, the mask layer 140 is removed, in accordance with some embodiments. The removal process includes an etching process, such as a dry etching process or a wet etching process, in accordance with some embodiments. In this step, a semiconductor structure 200 is substantially formed, in accordance with some embodiments.

Figure 3A:
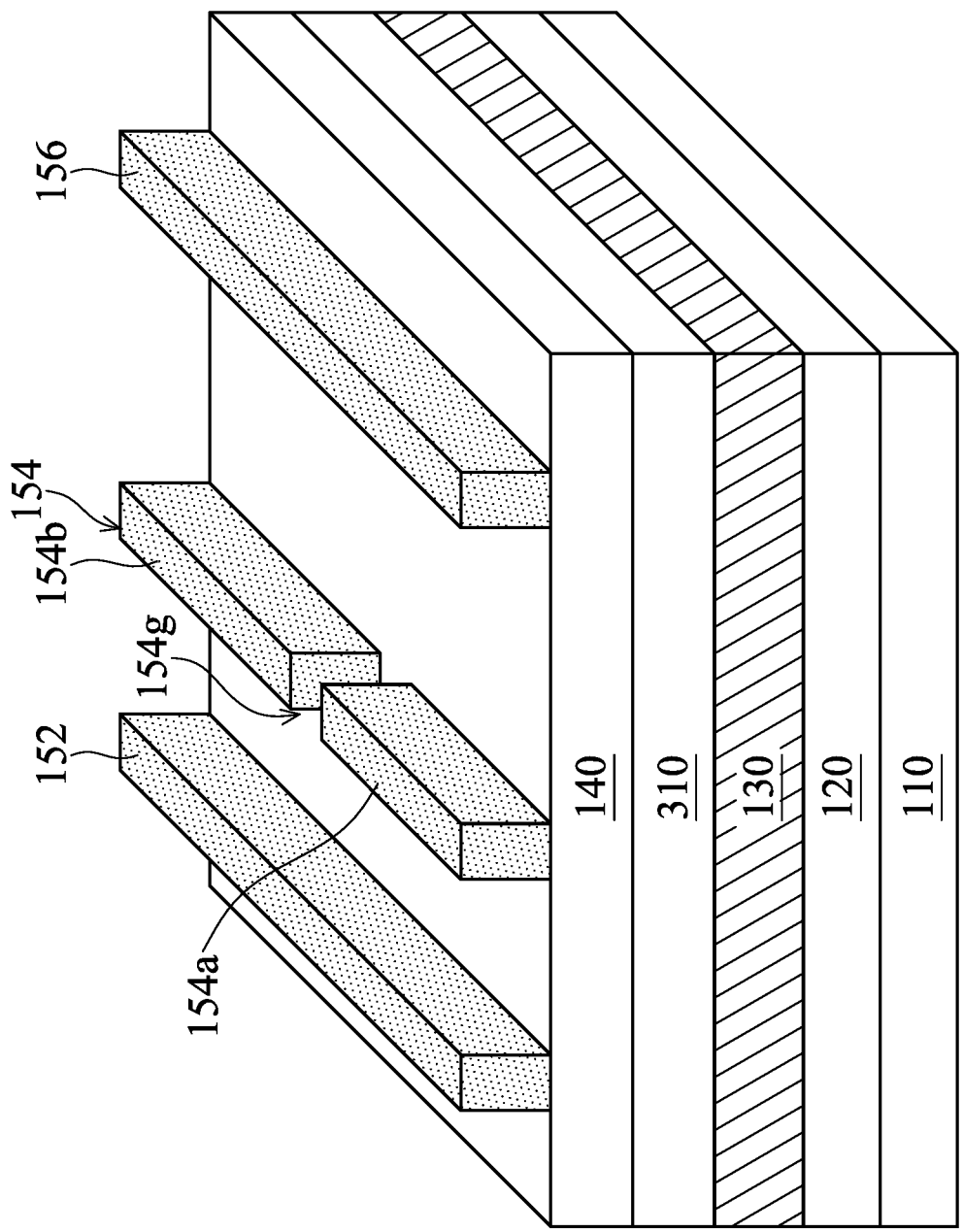
FIGS. 3A-3E are perspective views of various stages of a process for forming a semiconductor device structure, in accordance with some embodiments.

FIGS. 3A-3E are perspective views of various stages of a process for forming a semiconductor device structure, in accordance with some embodiments. As shown in FIG. 3A, the step of FIG. 1A and a step of forming a mask layer 310 over the layer 130 are performed to form the substrate 110, the dielectric layer 120, the layer 130, the mask layer 310, the mask layer 140, and the strip structures 152, 154, and 156, in accordance with some embodiments.

The mask layer 140 is formed over the mask layer 310, in accordance with some embodiments. The mask layers 140 and 310 and the layer 130 are made of different materials, in accordance with some embodiments. The mask layer 310 is made of or includes a dielectric material, such as an oxide-containing material or a nitride-containing material, in accordance with some embodiments.

The oxide-containing material includes $SiO_2$, HfO, $Al_2O_3$, $Ta_2O_5$, ZrO, SiON, or a combination thereof, in accordance with some embodiments. The nitride-containing material includes TiN, SiON, SiCN, SiN, or a combination thereof, in accordance with some embodiments.

The mask layer 310 is formed using a chemical vapor deposition (CVD) process, an atomic layer deposition (ALD) process, a physical vapor deposition (PVD) process, or a combination thereof, in accordance with some embodiments.

Figure 3B:
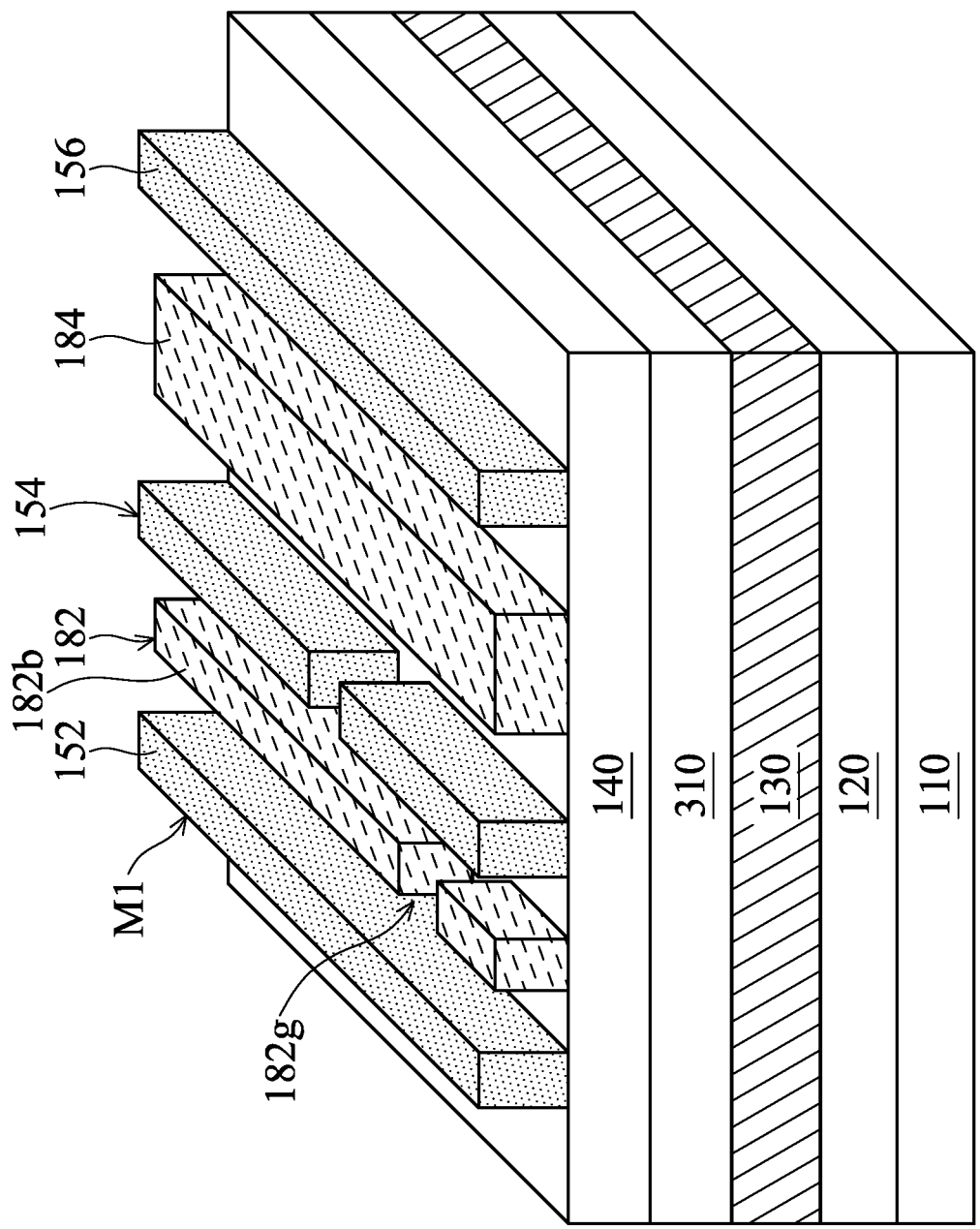

As shown in FIG. 3B, the steps of FIGS. 1B-2F are performed to form the strip structures 182 and 184 over the mask layer 140, in accordance with some embodiments. The strip structures 152, 154, 156, 182, and 184 together form a patterned mask layer M1, in accordance with some embodiments.

Figure 3C:
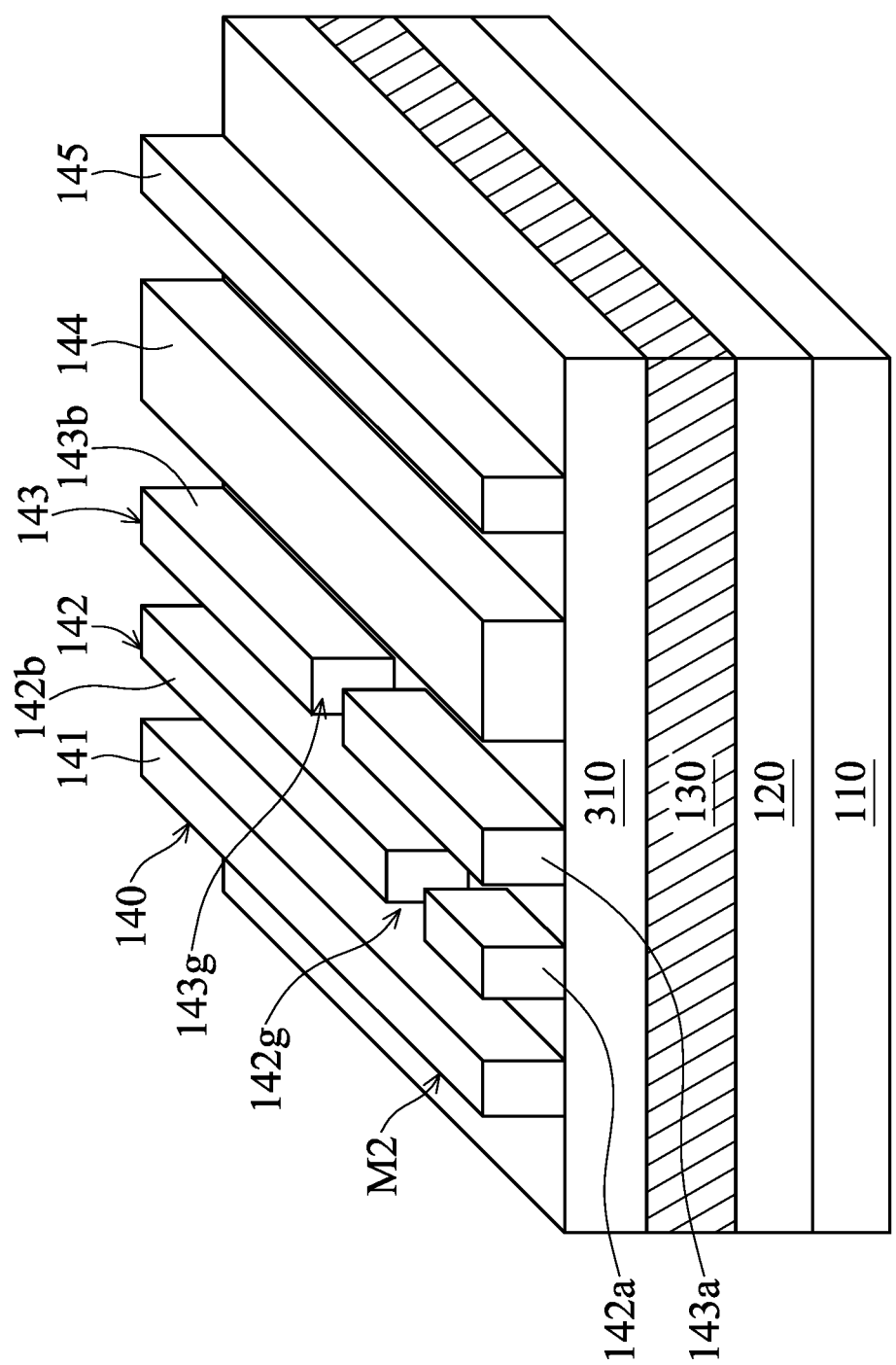

As shown in FIGS. 3B and 3C, the step of FIG. 2G is performed to remove portions of the mask layer 140, which are not covered by the patterned mask layer M1, and then remove the patterned mask layer M1, in accordance with some embodiments.

After the removal process, the mask layer 140 includes strip structures 141, 142, 143, 144, and 145, in accordance with some embodiments. The strip structures 141, 142, 143, 144, and 145 together form a patterned mask layer M2, in accordance with some embodiments.

The strip structures 141, 142, 143, 144, and 145 are parallel to each other, in accordance with some embodiments. The strip structure 142 has parts 142a and 142b, in accordance with some embodiments. The parts 142a and 142b are spaced apart from each other by a gap 142g, in accordance with some embodiments.

The strip structure 143 has parts 143a and 143b, in accordance with some embodiments. The parts 143a and 143b are spaced apart from each other by a gap 143g, in accordance with some embodiments. The removal process includes an etching process, such as an anisotropic etching process (e.g., a dry etching process), in accordance with some embodiments.

Figure 3D:
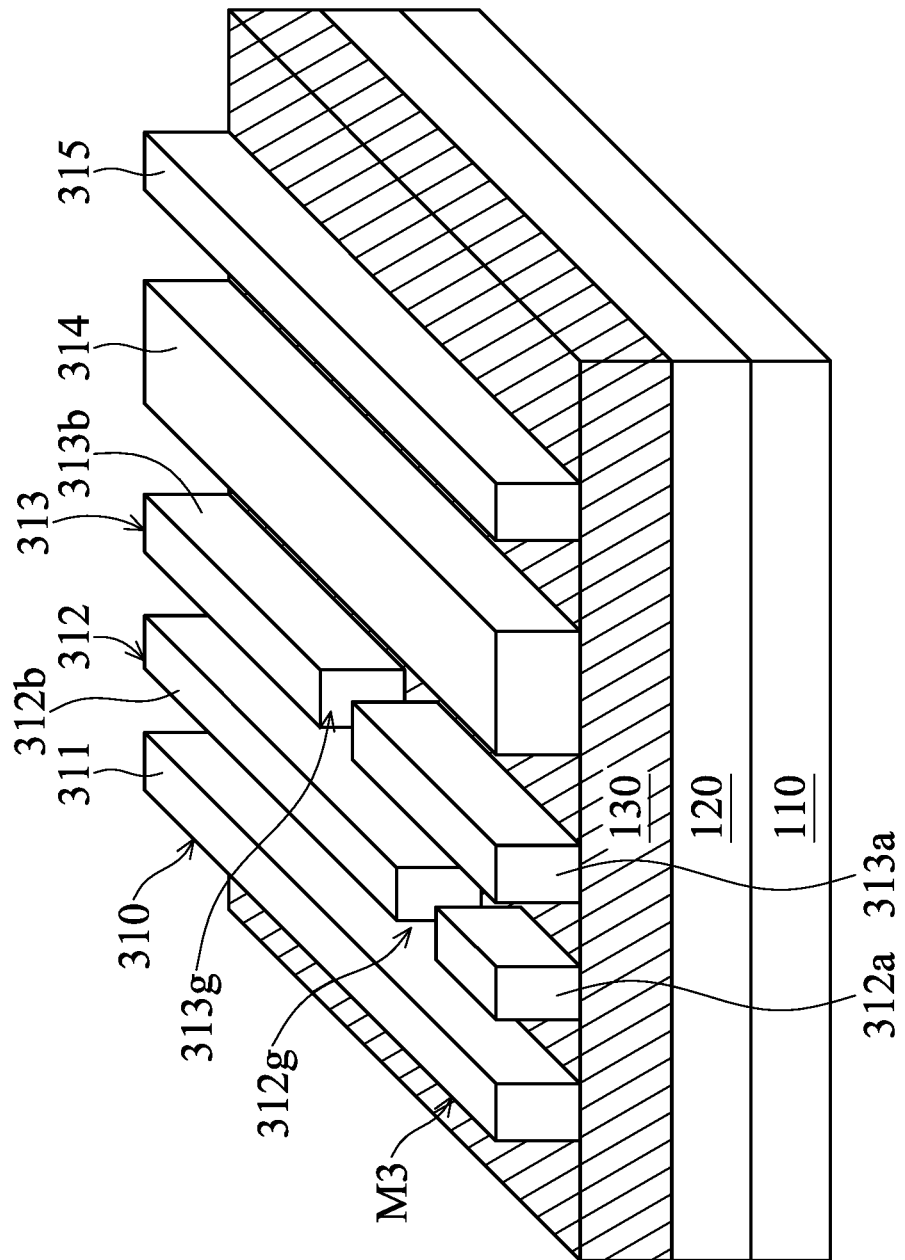

As shown in FIGS. 3C and 3D, portions of the layer 310, which are not covered by the patterned mask layer M2, are removed and then the patterned mask layer M2 is removed, in accordance with some embodiments.

After the removal process, the layer 310 includes strip structures 311, 312, 313, 314, and 315, in accordance with some embodiments. The strip structures 311, 312, 313, 314, and 315 together form a patterned mask layer M3, in accordance with some embodiments.

The strip structures 311, 312, 313, 314, and 315 are parallel to each other, in accordance with some embodiments. The strip structure 312 has parts 312a and 312b, in accordance with some embodiments. The parts 312a and 312b are spaced apart from each other by a gap 312g, in accordance with some embodiments.

The strip structure 313 has parts 313a and 313b, in accordance with some embodiments. The parts 313a and 313b are spaced apart from each other by a gap 313g, in accordance with some embodiments. The removal process includes an etching process, such as an anisotropic etching process (e.g., a dry etching process), in accordance with some embodiments.

Figure 3E:
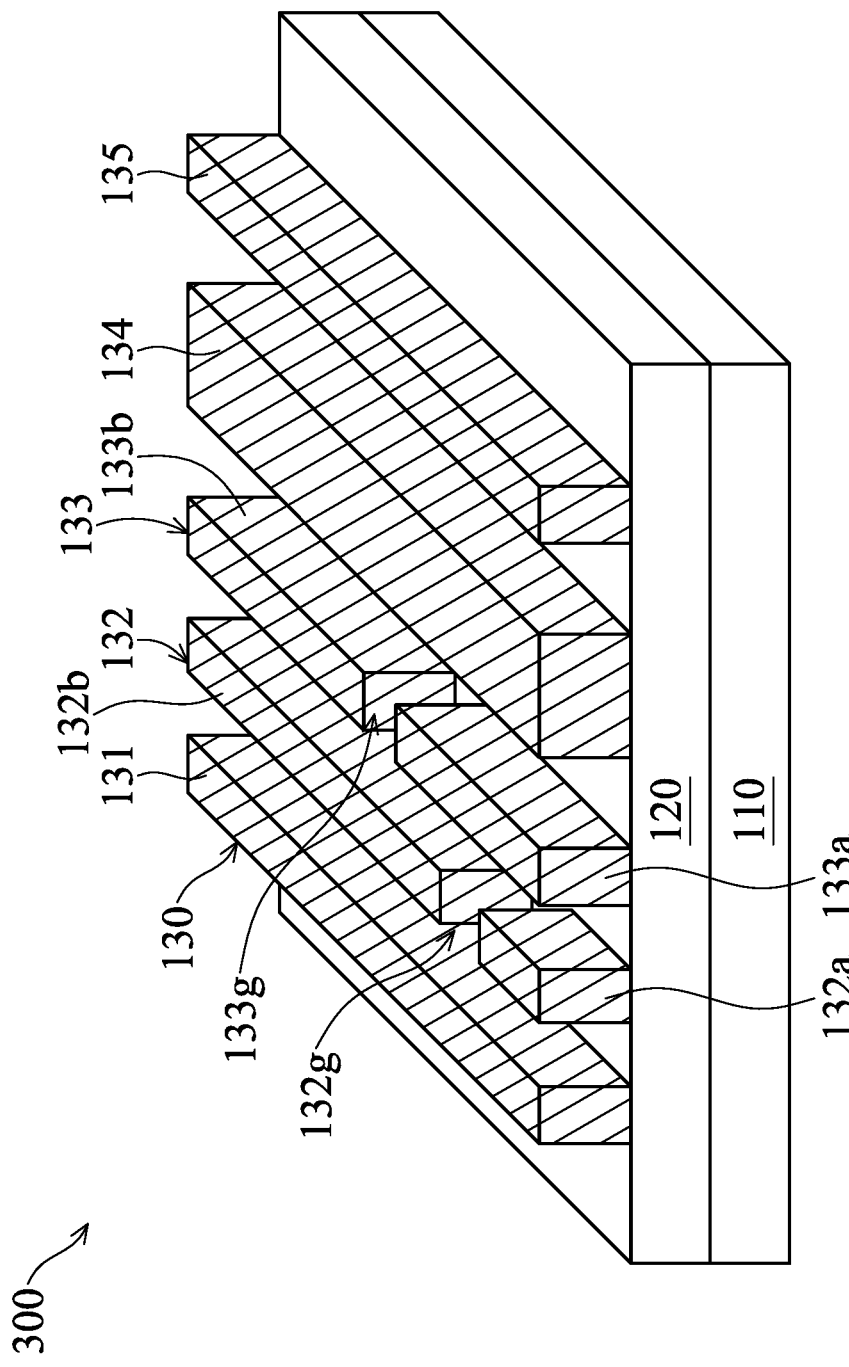

As shown in FIGS. 3D and 3E, portions of the layer 130, which are not covered by the patterned mask layer M3, are removed, in accordance with some embodiments. After the removal process, the layer 130 includes strip structures 131, 132, 133, 134, and 135, in accordance with some embodiments. The strip structures 131, 132, 133, 134, and 135 are also referred to as conductive lines, in accordance with some embodiments.

The strip structures 131, 132, 133, 134, and 135 are parallel to each other, in accordance with some embodiments. The strip structure 132 has parts 132a and 132b, in accordance with some embodiments. The parts 132a and 132b are spaced apart from each other by a gap 132g, in accordance with some embodiments.

The strip structure 133 has parts 133a and 133b, in accordance with some embodiments. The parts 133a and 133b are spaced apart from each other by a gap 133g, in accordance with some embodiments. The removal process includes an etching process, such as an anisotropic etching process (e.g., a dry etching process), in accordance with some embodiments.

As shown in FIG. 3E, the patterned mask layer M3 is removed, in accordance with some embodiments. The removal process includes an etching process, such as a dry etching process or a wet etching process, in accordance with some embodiments. In this step, a semiconductor device structure 300 is substantially formed, in accordance with some embodiments.

Figure 4A:
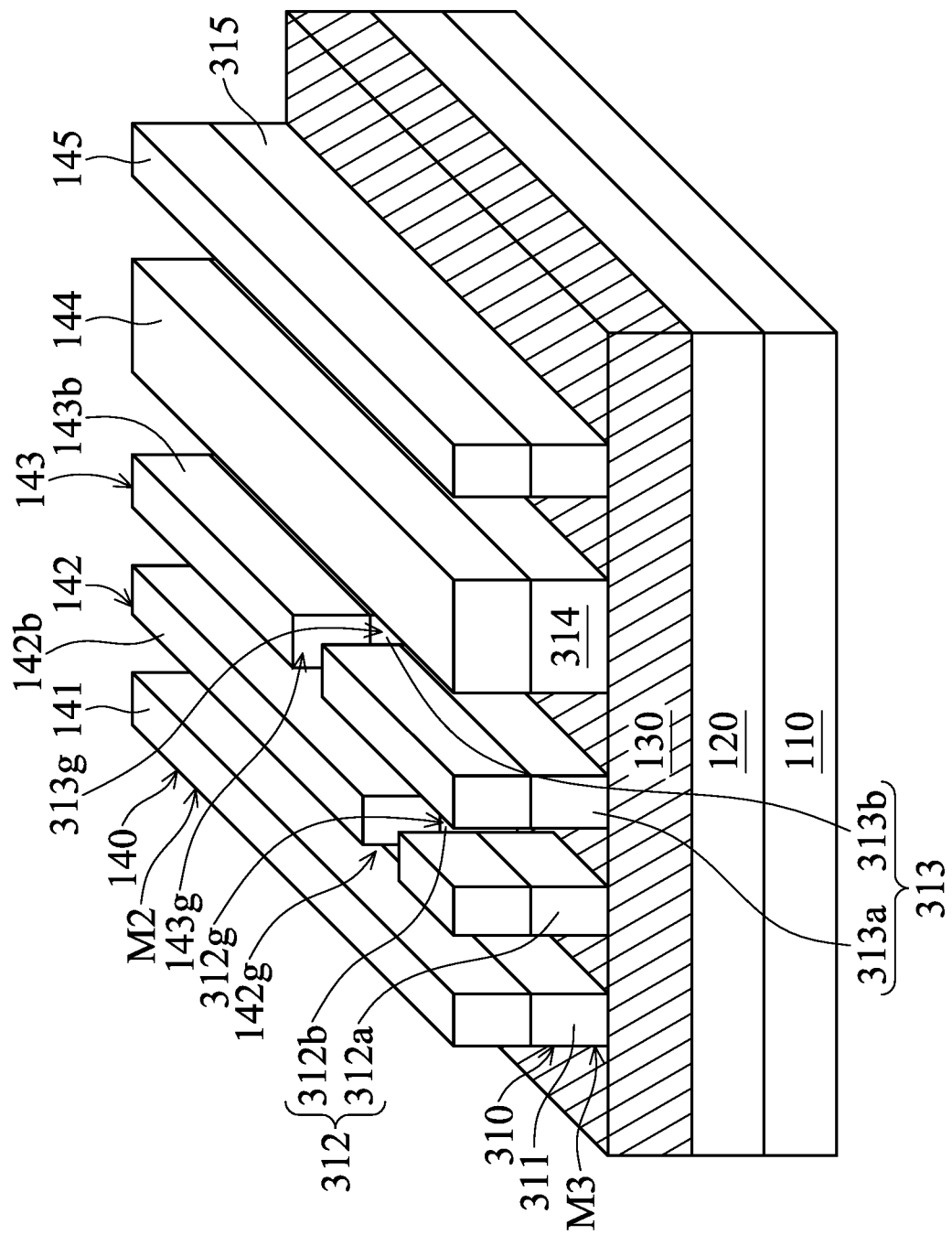
FIGS. 4A-4C are perspective views of various stages of a process for forming a semiconductor device structure, in accordance with some embodiments.
Figure 4B:
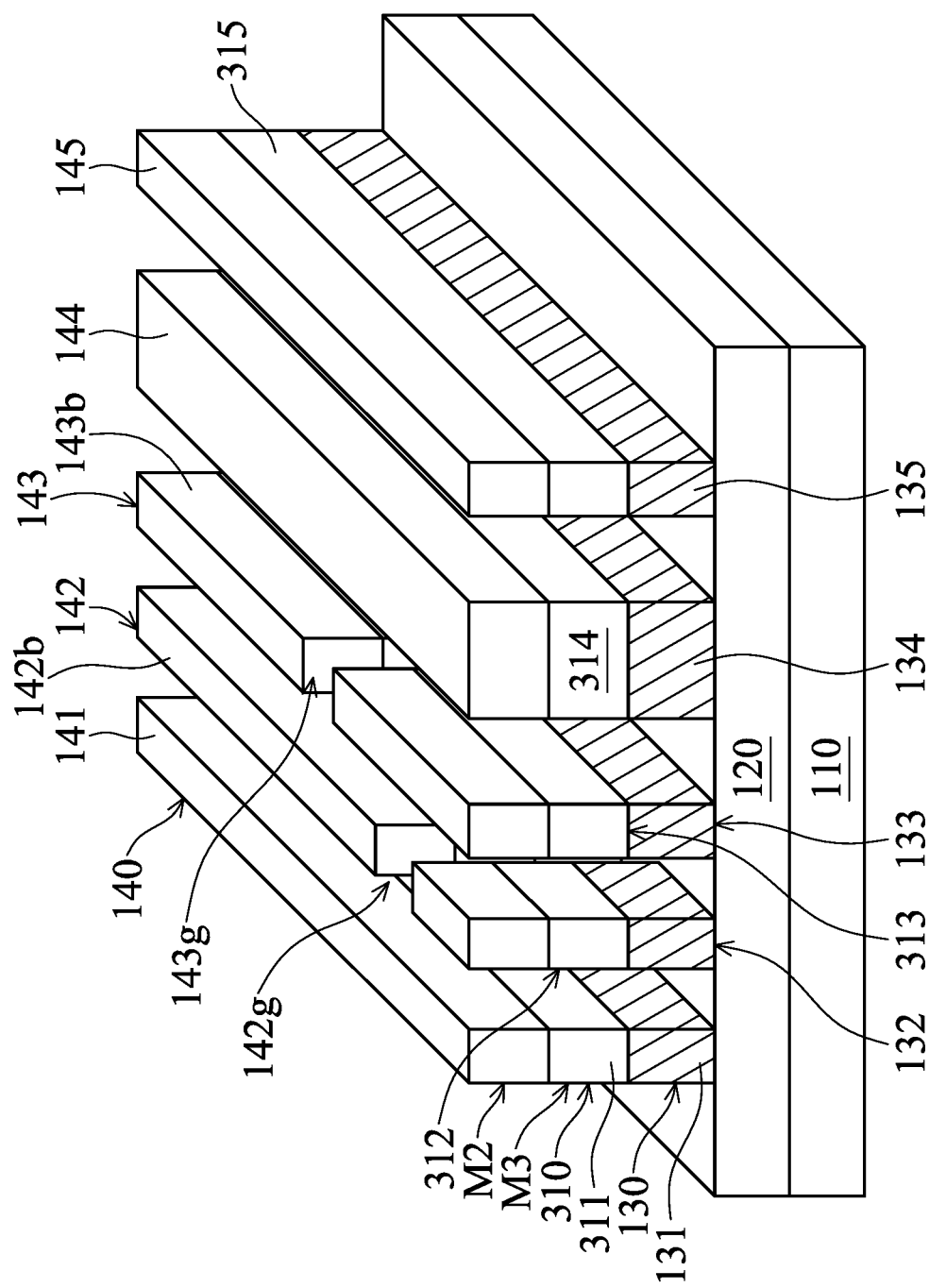
Figure 4C:
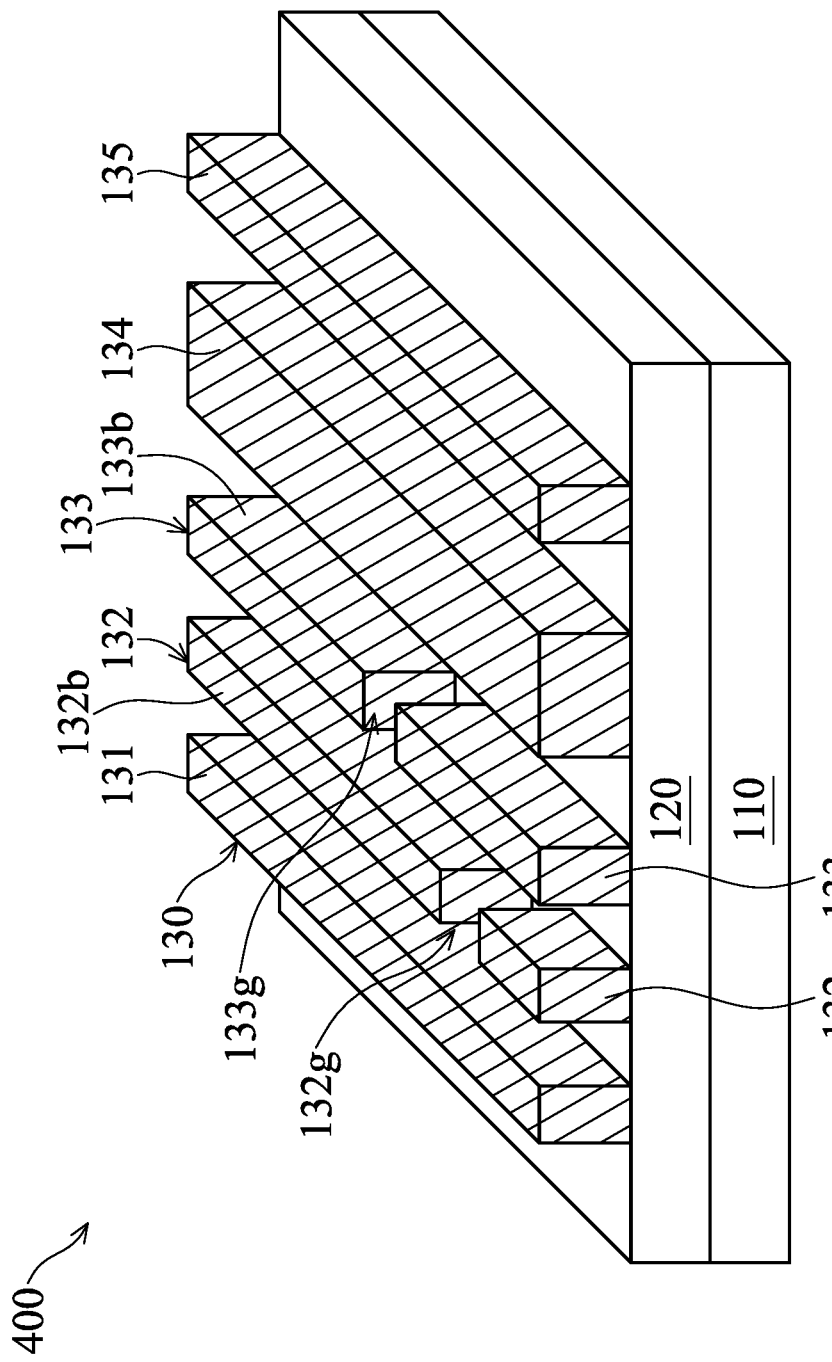

FIGS. 4A-4C are perspective views of various stages of a process for forming a semiconductor device structure, in accordance with some embodiments. After the step of FIG. 3C, as shown in FIG. 4A, portions of the layer 310, which are not covered by the patterned mask layer M2, are removed, in accordance with some embodiments.

After the removal process, the layer 310 includes strip structures 311, 312, 313, 314, and 315, in accordance with some embodiments. The strip structures 311, 312, 313, 314, and 315 together form a patterned mask layer M3, in accordance with some embodiments.

The strip structures 311, 312, 313, 314, and 315 are parallel to each other, in accordance with some embodiments. The strip structure 312 has parts 312a and 312b, in accordance with some embodiments. The parts 312a and 312b are spaced apart from each other by a gap 312g, in accordance with some embodiments.

The strip structure 313 has parts 313a and 313b, in accordance with some embodiments. The parts 313a and 313b are spaced apart from each other by a gap 313g, in accordance with some embodiments. The removal process includes an etching process, such as an anisotropic etching process (e.g., a dry etching process), in accordance with some embodiments.

As shown in FIG. 4B, portions of the layer 130, which are not covered by the patterned mask layers M2 and M3, are removed, in accordance with some embodiments. After the removal process, the layer 130 includes strip structures 131, 132, 133, 134, and 135, in accordance with some embodiments. The strip structures 131, 132, 133, 134, and 135 are also referred to as conductive lines, in accordance with some embodiments.

The strip structures 131, 132, 133, 134, and 135 are parallel to each other, in accordance with some embodiments. The structures of the strip structures 131, 132, 133, 134, and 135 are similar to or the same as that of the strip structures 131, 132, 133, 134, and 135 of FIG. 2H or 3E, in accordance with some embodiments. The removal process includes an etching process, such as an anisotropic etching process (e.g., a dry etching process), in accordance with some embodiments.

As shown in FIG. 4C, the patterned mask layers M2 and M3 are removed, in accordance with some embodiments. The removal process includes an etching process, such as a dry etching process or a wet etching process, in accordance with some embodiments. In this step, a semiconductor device structure 400 is substantially formed, in accordance with some embodiments.

The embodiments of FIGS. 3A-3E and 4A-4C illustrate only one layer 310 between the layer 130 and the mask layer 140, though the present application is not limited thereto. In some other embodiments (not shown), layers 310 are formed between the layer 130 and the mask layer 140, and the pattern of the patterned mask layer M1 (of FIG. 2F or 3B) is transferred to the mask layer 140 and the layers 310. The layers 310 are made of different materials, in accordance with some embodiments.

Elements designated by the same reference numbers as those in FIGS. 1A to 4C have the structures and the materials similar thereto or the same thereas. Therefore, the detailed descriptions thereof will not be repeated herein. Processes and materials for forming the semiconductor device structures 300 and 400 may be similar to, or the same as, those for forming the semiconductor structure 200 described above.

In accordance with some embodiments, methods for forming a patterned mask layer are provided. The methods (for forming the patterned mask layer) form first strip structures and second strip structures alternately arranged at intervals. The second strip structures are formed by forming a spacer layer over sidewalls of the first strip structures, forming the second strip structures between the spacer layer over the sidewalls, and removing the spacer layer. Therefore, the distance between the first strip structures and the second strip structures is adjustable by adjusting the thickness of the spacer layer. Furthermore, a block structure is formed over the spacer layer between two adjacent first strip structures before forming the second strip structures, and therefore the second strip structure formed between the two adjacent first strip structures is cut into two parts by the block structure. The block structure is removed in a subsequent process. Therefore, there is no need to perform a patterning process to cut the second strip structure into two parts, which saves the process cost and shortens the process time.

In accordance with some embodiments, a method for forming a patterned mask layer is provided. The method includes forming a first layer over a substrate. The method includes forming a first strip structure and a second strip structure over the first layer. The method includes forming a spacer layer conformally covering the first strip structure, the second strip structure, and the first layer. The spacer layer has a first trench between the first strip structure and the second strip structure. The method includes forming a block structure in the first trench. The method includes removing a first portion of the spacer layer, which is under the first trench and not covered by the block structure, and a second portion of the spacer layer, which is over the first strip structure and the second strip structure, to form a second trench and a third trench in the spacer layer and under the first trench. The method includes forming a third strip structure in the second trench and the third trench. The method includes removing the block structure. The method includes removing the spacer layer. The first strip structure, the second strip structure, and the third strip structure together form a patterned mask layer.

In accordance with some embodiments, a method for forming a patterned mask layer is provided. The method includes forming a layer over a substrate. The method includes forming a first strip structure and a second strip structure over the layer. The method includes forming a spacer layer conformally covering the first strip structure, the second strip structure, and the layer. The spacer layer has a first trench between the first strip structure and the second strip structure. The method includes removing a first portion of the spacer layer, which is under the first trench, and a second portion of the spacer layer, which is over the first strip structure and the second strip structure, to form a second trench in the spacer layer and under the first trench. The method includes forming a third strip structure and a fourth strip structure over the layer. The third strip structure is in the second trench, and the first strip structure is between the third strip structure and the fourth strip structure. The method includes removing a side portion of the fourth strip structure to narrow the fourth strip structure. The method includes removing the spacer layer.

In accordance with some embodiments, a method for forming a patterned mask layer is provided. The method includes forming a first layer over a substrate. The method includes forming a first strip structure and a second strip structure over the first layer. The method includes forming a spacer layer covering the first strip structure, the second strip structure, and the first layer. The spacer layer has a first trench between the first strip structure and the second strip structure. The method includes forming a block structure in the first trench. The method includes partially removing the spacer layer. The spacer layer remains over a first sidewall of the first strip structure, a second sidewall of the second strip structure, and under the block structure after partially removing the spacer layer. The method includes forming a third strip structure between the spacer layer remaining over the first sidewall of the first strip structure and the second sidewall of the second strip structure. The method includes removing the block structure. The method includes removing the spacer layer. The first strip structure, the second strip structure, and the third strip structure together form a patterned mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a patterned mask layer, comprising:
    forming a first layer over a substrate;
    forming a first strip structure and a second strip structure over the first layer;
    forming a spacer layer conformally covering the first strip structure, the second strip structure, and the first layer, wherein the spacer layer has a first trench between the first strip structure and the second strip structure;
    forming a block structure in the first trench;
    removing a first portion of the spacer layer, which is under the first trench and not covered by the block structure, and a second portion of the spacer layer, which is over the first strip structure and the second strip structure, to form a second trench and a third trench in the spacer layer and under the first trench;
    forming a third strip structure in the second trench and the third trench;
    removing the block structure; and
    removing the spacer layer, wherein the first strip structure, the second strip structure, and the third strip structure together form a patterned mask layer.

2. The method for forming the patterned mask layer as claimed in claim 1, wherein the block structure and the spacer layer are made of different materials.

3. The method for forming the patterned mask layer as claimed in claim 1, wherein the first strip structure and the second strip structure are made of a first material.

4. The method for forming the patterned mask layer as claimed in claim 3, wherein the spacer layer is made of a second material, and the second material is different from the first material.

5. The method for forming the patterned mask layer as claimed in claim 3, wherein the block structure is made of a second material, and the second material is different from the first material.

6. The method for forming the patterned mask layer as claimed in claim 1, wherein the block structure and the third strip structure are made of different materials.

7. The method for forming the patterned mask layer as claimed in claim 1, wherein the spacer layer and the third strip structure are made of different materials.

8. The method for forming the patterned mask layer as claimed in claim 1, wherein a first top surface of the block structure is lower than a second top surface of the spacer layer.

9. The method for forming the patterned mask layer as claimed in claim 8, wherein the first top surface of the block structure is lower than a third top surface of the first strip structure.

10. The method for forming the patterned mask layer as claimed in claim 9, wherein a fourth top surface of the third strip structure is lower than the second top surface of the spacer layer and the third top surface of the first strip structure.

11. The method for forming the patterned mask layer as claimed in claim 1, further comprising:
    after removing the spacer layer, partially removing the first layer, which is not covered by the patterned mask layer; and
    removing the patterned mask layer.

12. The method for forming the patterned mask layer as claimed in claim 11, further comprising:
    forming a second layer over the substrate before forming the first layer over the substrate, wherein the first layer is formed over the second layer;
    after removing the patterned mask layer, partially removing the second layer, which is not covered by the first layer; and
    removing the first layer.

13. A method for forming a patterned mask layer, comprising:
    forming a layer over a substrate;
    forming a first strip structure and a second strip structure over the layer;
    forming a spacer layer conformally covering the first strip structure, the second strip structure, and the layer, wherein the spacer layer has a first trench between the first strip structure and the second strip structure;

removing a first portion of the spacer layer, which is under the first trench, and a second portion of the spacer layer, which is over the first strip structure and the second strip structure, to form a second trench in the spacer layer and under the first trench, wherein after the first portion of the spacer layer is removed, a lower portion of the spacer layer remains under the first trench, the second trench has a first part and a second part, and the lower portion of the spacer layer separates the first part from the second part;

forming a third strip structure and a fourth strip structure over the layer, wherein the third strip structure is in the second trench, the third strip structure has a third part and a fourth part, the third part and the fourth part are respectively in the first part and the second part of the second trench, and the first strip structure is between the third strip structure and the fourth strip structure;

removing a side portion of the fourth strip structure to narrow the fourth strip structure; and removing the spacer layer.

14. The method for forming the patterned mask layer as claimed in claim 13, further comprising:

forming a fifth strip structure over the layer during forming the first strip structure and the second strip structure over the layer, wherein the spacer layer further conformally covers the fifth strip structure and has a third trench between the first strip structure and the fifth strip structure, the removing of the first portion and the second portion of the spacer layer further removes a third portion of the spacer layer, which is under the third trench, and a fourth portion of the spacer layer, which is over the fifth strip structure, to form a fourth trench in the spacer layer and under the third trench, and the fourth strip structure is in the fourth trench.

15. The method for forming the patterned mask layer as claimed in claim 13, wherein the fourth strip structure is narrower than the fourth trench after removing the side portion of the fourth strip structure.

16. The method for forming the patterned mask layer as claimed in claim 13, wherein the first strip structure and the second strip structure are made of a first material, the third strip structure and the fourth strip structure are made of a second material, and the second material is different from the first material.

17. The method for forming the patterned mask layer as claimed in claim 16, wherein the spacer layer is made of a third material, and the third material is different from the first material and the second material.

18. A method for forming a patterned mask layer, comprising:

forming a first layer over a substrate;

forming a first strip structure and a second strip structure over the first layer;

forming a spacer layer covering the first strip structure, the second strip structure, and the first layer, wherein the spacer layer has a first trench between the first strip structure and the second strip structure;

forming a block structure in the first trench;

partially removing the spacer layer, wherein the spacer layer remains over a first sidewall of the first strip structure, a second sidewall of the second strip structure, and under the block structure after partially removing the spacer layer;

forming a third strip structure between the spacer layer remaining over the first sidewall of the first strip structure and the second sidewall of the second strip structure;

removing the block structure; and removing the spacer layer, wherein the first strip structure, the second strip structure, and the third strip structure together form a patterned mask layer.

19. The method for forming the patterned mask layer as claimed in claim 18, wherein the spacer layer remaining under the block structure connects the spacer layer remaining over the first sidewall of the first strip structure to the spacer layer remaining over the second sidewall of the second strip structure.

20. The method for forming the patterned mask layer as claimed in claim 18, wherein the first strip structure, the spacer layer, and the block structure are made of different materials.

* * * * *